(12) United States Patent
Lee et al.

(10) Patent No.: US 11,132,955 B2
(45) Date of Patent: Sep. 28, 2021

(54) DISPLAY APPARATUS

(71) Applicant: LG Display Co., Ltd., Seoul (KR)

(72) Inventors: JungHyun Lee, Paju-si (KR); Yewon Hong, Paju-si (KR); TaeWoong Moon, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 16/517,178

(22) Filed: Jul. 19, 2019

(65) Prior Publication Data

US 2020/0027405 A1 Jan. 23, 2020

(30) Foreign Application Priority Data

Jul. 20, 2018 (KR) .................. 10-2018-0084956

(51) Int. Cl.

| | |
|---|---|
| *G09G 3/32* | (2016.01) |
| *G09G 3/36* | (2006.01) |
| *G09G 3/20* | (2006.01) |
| *H01L 27/32* | (2006.01) |
| *H03F 3/50* | (2006.01) |
| *G09G 3/3291* | (2016.01) |
| *G09G 3/3225* | (2016.01) |
| *H01L 27/12* | (2006.01) |

(52) U.S. Cl.
CPC .......... *G09G 3/3291* (2013.01); *G09G 3/3225* (2013.01); *G09G 2300/0417* (2013.01); *H01L 27/1225* (2013.01); *H01L 27/3244* (2013.01)

(58) Field of Classification Search
CPC .......... G09G 3/3225–3291; G09G 2300/0417; H01L 27/1225–3244; H03F 3/505
See application file for complete search history.

(56) References Cited

U.S. PATENT DOCUMENTS

| | | | |
|---|---|---|---|
| 2005/0258997 A1* | 11/2005 | Kim | ................ H03F 3/505 341/155 |
| 2005/0270257 A1* | 12/2005 | Shin | ................ G09G 3/3275 345/76 |
| 2005/0270258 A1* | 12/2005 | Shin | ................ G09G 3/3275 345/76 |
| 2015/0255030 A1* | 9/2015 | Watsuda | ........... G09G 3/3648 345/92 |
| 2016/0071463 A1* | 3/2016 | Takahashi | ........... H01L 27/3262 345/76 |

(Continued)

*Primary Examiner* — Lin Li
(74) *Attorney, Agent, or Firm* — Fenwick & West LLP

(57) ABSTRACT

A display apparatus is disclosed, which comprises a demultiplexing circuit portion for sequentially supplying data signals supplied from a data driving circuit to at least two data lines, the demultiplexing circuit portion including a switching portion for sequentially supplying the data signals to at least two data lines based on a voltage of a control line, a voltage controller for controlling the voltage of the control line in response to a time-division control signal and an auxiliary signal partially overlapped with the time-division control signal, and a voltage discharge portion for discharging the voltage of the control line in response to the time-division control signal. Therefore, an off current capable of being transferred to an organic light emitting diode may be prevented from occurring, a bezel area may be minimized, and an image of high resolution of a display panel may be embodied.

15 Claims, 24 Drawing Sheets

(56) References Cited

U.S. PATENT DOCUMENTS

| | | | | |
|---|---|---|---|---|
| 2016/0171924 A1* | 6/2016 | Kim | ................ | G09G 3/3648 |
| | | | | 345/214 |
| 2016/0189671 A1* | 6/2016 | Kim | ................ | G09G 3/3291 |
| | | | | 345/690 |
| 2016/0293093 A1* | 10/2016 | Seo | ................ | G09G 3/20 |
| 2016/0329025 A1* | 11/2016 | Park | ................ | G09G 3/3648 |
| 2017/0076665 A1* | 3/2017 | Kim | ................ | G09G 3/3275 |

\* cited by examiner

DISPLAY APPARATUS

CROSS-REFERENCE TO RELATED APPLICATIONS

This application claims the benefit of the Korean Patent Application No. 10-2018-0084956 filed on Jul. 20, 2018, which is hereby incorporated by reference as if fully set forth herein.

BACKGROUND

Technical Field

The present disclosure relates to a display apparatus.

Description of the Related Art

A display apparatus is widely used as a display screen of a notebook computer, a tablet computer, a smartphone, a portable display device, and a portable information device in addition to a display apparatus of a television or a monitor.

The display apparatus includes a display panel and a driving integrated circuit and a scan driving circuit for driving the display panel. The display panel includes a plurality of subpixels provided per pixel area defined by a plurality of data lines and a plurality of gate lines, having a thin film transistor. In this case, at least three adjacent subpixels constitute a unit pixel for displaying one image.

The driving integrated circuit is connected with each of the plurality of data lines in a one-to-one relationship through a plurality of data link lines. The driving integrated circuit supplies a data voltage to each of the plurality of data lines. The scan driving circuit is connected with each of the plurality of gate lines in a one-to-one relationship through a plurality of gate link lines. The scan driving circuit supplies a scan signal to each of the plurality of gate lines.

Generally, the display apparatus may use a low-temperature polycrystalline silicon (LTPS) based thin film transistor and an oxide based thin film transistor. In the display apparatus of the related art, the driving integrated circuit is packaged in a flexible circuit film to reduce a bezel area there below, and the number of channels of the driving integrated circuit is reduced through data time division driving using demultiplexing circuits.

At this time, the display apparatus needs a demultiplexing circuit based on the oxide based thin film transistor to embody an image of high resolution while reducing the number of channels of the driving integrated circuit. However, the oxide based thin film transistor has problems in that electron mobility is lower than that of the LTPS based thin film transistor and degradation may occur in case of a use for a long time. Also, if electron mobility of the thin film transistor of the demultiplexing circuit is reduced, it is difficult to embody an image of high resolution, and if the thin film transistor of the demultiplexing circuit is degraded, an off current transferred to an organic light emitting diode occurs, whereby a problem occurs in that luminance of the display panel is deteriorated.

Therefore, a technology capable of stably maintaining an output of the demultiplexing circuit using the oxide based thin film transistor by solving the above problem is required.

SUMMARY

The present disclosure has been made in view of the above problems, and it is an object of the present disclosure to provide a display apparatus comprising a demultiplexing circuit portion using an oxide based thin film transistor, the demultiplexing circuit portion being capable of maintaining a stable output by overcoming a limitation due to low mobility and degradation as compared with an LTPS based thin film transistor by reinforcing a discharge function of a control line in response to a time-division control signal.

It is another object of the present disclosure to provide a display apparatus comprising a demultiplexing circuit portion using an oxide based thin film transistor, which may reinforce a pixel charging rate by enhancing charging of a control line and therefore improve discharge characteristic of the control line.

It is still another object of the present disclosure to provide a display apparatus comprising a demultiplexing circuit portion using an oxide based thin film transistor, in which an off current capable of being transferred to an organic light emitting diode is prevented from occurring, a bezel area is minimized, and an image of high resolution of a display panel is embodied.

It is further still another object of the present disclosure to provide a display apparatus in which a demultiplexing circuit portion using an oxide based thin film transistor is embodied through a back channel etch (BCE) process to minimize a mask process, improve a lithography process margin and provide excellent reliability.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a display apparatus comprising a demultiplexing circuit portion for sequentially supplying data signals supplied from a data driving circuit to at least two kinds of data lines, the demultiplexing circuit portion including a switching portion for sequentially supplying the data signals to at least two kinds of data lines based on a voltage of a control line, a voltage controller for controlling the voltage of the control line in response to a time-division control signal and an auxiliary signal partially overlapped with the time-division control signal, and a voltage discharge portion for discharging the voltage of the control line in response to the time-division control signal.

In accordance with another aspect of the present disclosure, the above and other objects can be accomplished by the provision of a display apparatus comprising n data lines, a demultiplexing circuit portion connected to first to ith (i is a natural number of 2 or more) control lines and connected to the n data lines, and a data driving circuit having first to n/ith output channels connected to the demultiplexing circuit portion, the demultiplexing circuit portion including a voltage controller for controlling voltages of the first to ith control lines in response to first to ith time-division control signals and auxiliary signals partially overlapped with each of the first to ith time-division control signals, a switching portion for sequentially supplying data signals supplied from the first to n/ith output channels to the n data lines based on the voltage of each of the first to ith control lines, and a voltage discharge portion for discharging the voltages of the first to ith control lines in response to the first to ith time-division control signals.

Embodiments also relate to a method of driving a display apparatus including a plurality of data lines each connected to a corresponding column of pixels, a demultiplexing circuit including a first set of switches connected to a first set of data lines and to a first control line, a second set of switches connected to a second set of data lines and to a second control line, a first discharge portion connected to the first control line, and a second discharge portion connected to the second control line. A plurality of data signals are received from a data driving circuit for supply to the plurality of data lines during a horizontal period that includes at least a first sub-horizontal period and a second sub-horizontal period subsequent the first sub-horizontal period. The plurality of data signals include first data signals for supply to the first set of data lines during the first sub-horizontal period, and second data signals for supply to the second set of data lines during the second sub-horizontal period. The first set of switches are turned on for the first sub-horizontal period to supply the first data signals to the first set of data lines. The first control line is discharged by turning on the first discharge portion. The second set of switches are turned on for the second sub-horizontal period to supply the second data signals to the second set of data lines. The he second control line is discharged by turning on the second discharge portion.

Embodiments also relate to a display apparatus including a plurality of pixels on a substrate, a plurality of data lines on the substrate, a data line connected to a corresponding column of pixels, a first control line connected to a first set of data lines, a second control line connected to a second set of data lines, and a demultiplexing circuit. The demultiplexing circuit is configured to receive a plurality of data signals from a data driving circuit for supply to the plurality of data lines during a horizontal period that includes at least a first sub-horizontal period and a second sub-horizontal period subsequent the first sub-horizontal period. The plurality of data signals include first data signals for supply to the first set of data lines during the first sub-horizontal period, and second data signals for supply to the second set of data lines during the second sub-horizontal period. The demultiplexing circuit includes a first set of switches connected to the first set of data lines and to a first control line, the first set of switches configured to turn on for the first sub-horizontal period to supply the first data signals to the first set of data lines, a first discharge portion connected to the first control line. The first discharge portion is configured to discharge the first control line when turned on. The demultiplexing circuit also includes a second set of switches connected to a second set of data lines and to a second control line, the second set of switches configured to turn on for the second sub-horizontal period to supply the second data signals to the second set of data lines, and a second discharge portion connected to the second control line. The second discharge portion is configured to discharge the second control line when turned on.

Details of the other embodiments are included in the detailed description and drawings.

Since the display apparatus according to the present disclosure comprises a demultiplexing circuit portion using an oxide based thin film transistor, the demultiplexing circuit portion is capable of maintaining a stable output by overcoming a limitation due to low mobility and degradation as compared with an LTPS based thin film transistor by reinforcing a discharge function of a control line in response to a time-division control signal.

Since the display apparatus according to the present disclosure comprises a demultiplexing circuit portion using an oxide based thin film transistor, it is possible to reinforce a pixel charging rate by enhancing charging of a control line and therefore improve discharge characteristic of the control line.

Since the display apparatus according to the present disclosure comprises a demultiplexing circuit portion using an oxide based thin film transistor, an off current capable of being transferred to an organic light emitting diode may be prevented from occurring, a bezel area may be minimized, and an image of high resolution of a display panel may be embodied.

In the display apparatus according to the present disclosure, a demultiplexing circuit portion using an oxide based thin film transistor is embodied through a back channel etch (BCE) process, whereby it is possible to minimize a mask process, improve a lithography process margin and provide excellent reliability.

In addition to the effects of the present disclosure as mentioned above, additional advantages and features of the present disclosure will be clearly understood by those skilled in the art from the following description of the present disclosure.

BRIEF DESCRIPTION OF THE DRAWINGS

The above and other objects, features and other advantages of the present disclosure will be more clearly understood from the following detailed description taken in conjunction with the accompanying drawings.

DETAILED DESCRIPTION

Figure 1:
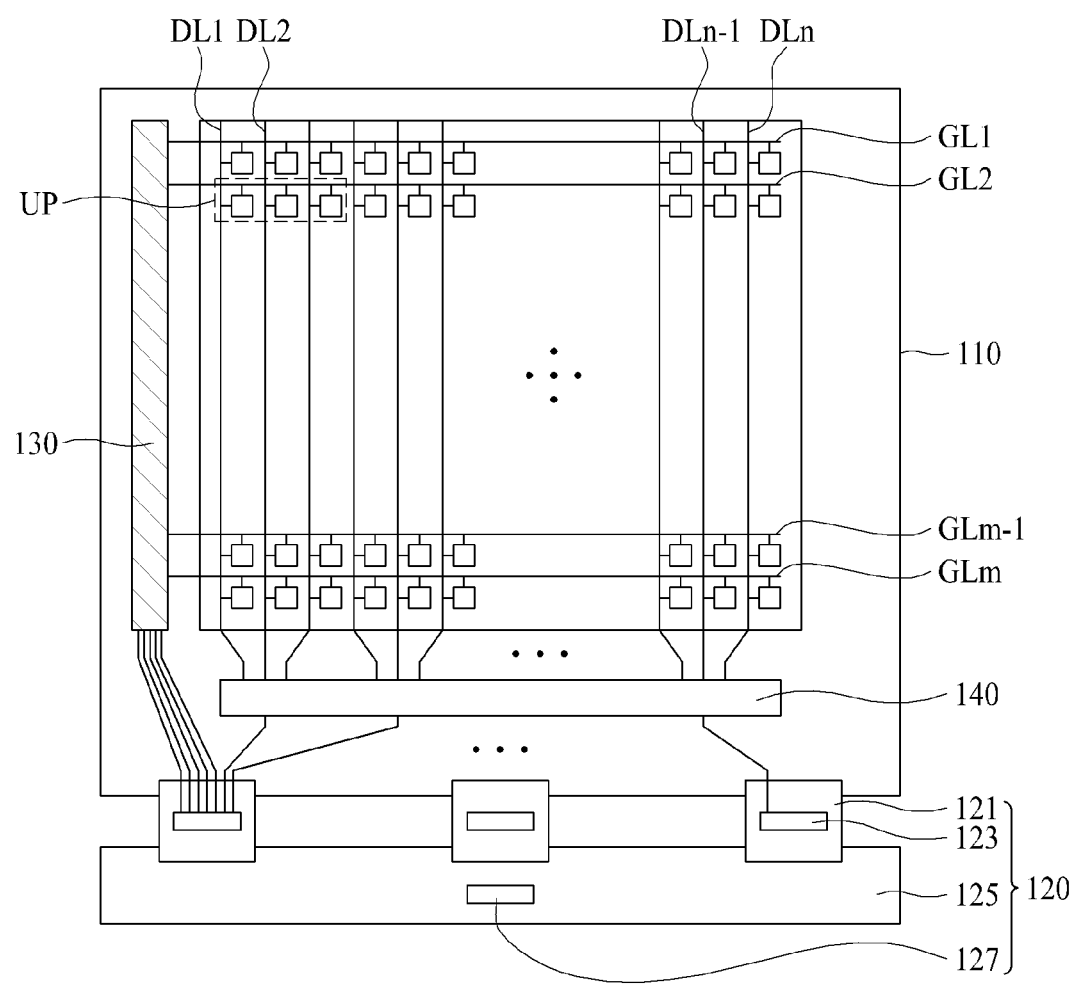
FIG. 1 is a plane view illustrating a display apparatus according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first", "second", etc. may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Therefore, the display apparatus of the present disclosure may comprise a display apparatus of a narrow meaning such as a liquid crystal module (LCM) or an organic light emitting display module (OLED), and may comprise a set apparatus which is an application product or a final consumer product including an LCM, an OLED module, etc.

For example, if the display panel is an OLED display panel, the display panel may include a plurality of gate and data lines, and pixels formed in crossing areas of the gate lines and the data lines. Also, the display panel may include an array substrate including a thin film transistor which is an element for selectively applying a voltage to each pixel, an organic light emitting diode (OLED) layer on the array substrate, and an encapsulation substrate arranged on the array substrate to cover the OLED layer. The encapsulation substrate may protect the thin film transistor and the OLED layer from external impact, and may prevent water or oxygen from being permeated into the OLED layer. The layer formed on the array substrate may include an inorganic light emitting layer, for example, nano-sized material layer or quantum dot.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the embodiments of the present disclosure will be described with reference to the accompanying drawings and examples.

FIG. 1 is a plane view illustrating a display apparatus according to one embodiment of the present disclosure.

Referring to FIG. 1, the display apparatus comprises a substrate 110, a data driving circuit portion 120, a scan driving circuit portion 130, and a demultiplexing circuit portion 140.

The substrate 110 may be made of glass or plastic. According to one example, the substrate 110 may be made of a transparent plastic having flexible characteristic, for example, polyimide.

The substrate 110 includes a plurality of pixels provided by crossing of n data lines DL1 to DLn and m gate lines GL1 to GLm. One pixel may include red subpixels, green subpixels, and blue subpixels, and adjacent red green and blue subpixels may constitute one unit pixel UP.

The data driving circuit portion 120 may include a plurality of circuit films 121, a plurality of driving integrated circuits 123, a printed circuit board 125, and a timing controller 127.

Each of the plurality of circuit films 121 may be attached between a pad portion of the substrate 110 and the printed circuit board 125. For example, an input terminal provided at one side of each of the plurality of circuit films 121 may be attached to the printed circuit board 125 by a film attachment process, and an output terminal provided at the other side of each of the plurality of circuit films 121 may be attached to the pad portion of the substrate 110 by a film attachment process.

Each of the plurality of driving integrated circuits 123 may be packaged in each of the plurality of circuit films 121. Each of the plurality of driving integrated circuits 123 may receive a data control signal and pixel data supplied from the timing controller 127, convert the pixel data to an analog type data signal per pixel in accordance with the data control signal and supply the converted data signal to a corresponding data line.

The printed circuit board 125 may support the timing controller 127 and may transfer signals and power sources between elements of the data driving circuit portion 120.

The timing controller 127 may be packaged in the printed circuit board 125, and may receive image data and a timing synchronization signal supplied from a display driving system through a user connector provided in the printed circuit board 125. The timing controller 127 may generate each of a data control signal and a scan control signal based on the timing synchronization signal, control a driving timing of each of the driving integrated circuits 123 through the data control signal and control a driving timing of the scan driving circuit portion through the scan control signal.

The scan driving circuit portion 130 may be arranged at one side corner of the substrate 110 to be connected to each of the m gate lines GL1 to GLm. At this time, the scan driving circuit portion 130 may be formed together with a manufacturing process of a thin film transistor of each pixel. The scan driving circuit portion 130 may generate scan pulses in accordance with the gate control signal supplied from the driving integrated circuit 123 and sequentially supply the scan pulses to each of the m gate lines GL1 to GLm. According to one example, the scan driving circuit portion 130 may include m stages (not shown) respectively connected to the m gate lines GL1 to GLm.

The demultiplexing circuit portion 140 may sequentially supply the data signals supplied from the data driving circuit portion 120 to at least two kinds of data lines DL. In detail, the demultiplexing circuit portion 140 may be arranged at one side of the substrate 110 to be connected to each of output channels CH of the driving integrated circuit 123 and to be electrically connected to each of the n data lines DL1 to DLn provided in the substrate 110. The demultiplexing circuit portion 140 may sequentially distribute the data signals input per a plurality of sub horizontal periods of one horizontal period from the driving integrated circuit 123 to the n data lines DL1 to DLn. For example, the data signals may include first data signals for supply to a first set of data lines during a first sub-horizontal period, and second data signals for supply to a second set of data lines during a second sub-horizontal period subsequent the first sub-horizontal period.

According to one example, if the demultiplexing circuit portion 140 is connected to i control lines (i is a natural number of 2 or more) and connected to n data lines DL, the plurality of driving integrated circuits 123 of the data driving circuit portion 120 may have n/i output channels. Therefore, as the display apparatus includes the demultiplexing circuit portion 140 connected to the i control lines, the number of channels of the plurality of driving integrated circuits 123 may be reduced and at the same time image of high resolution may be embodied.

Figure 2:
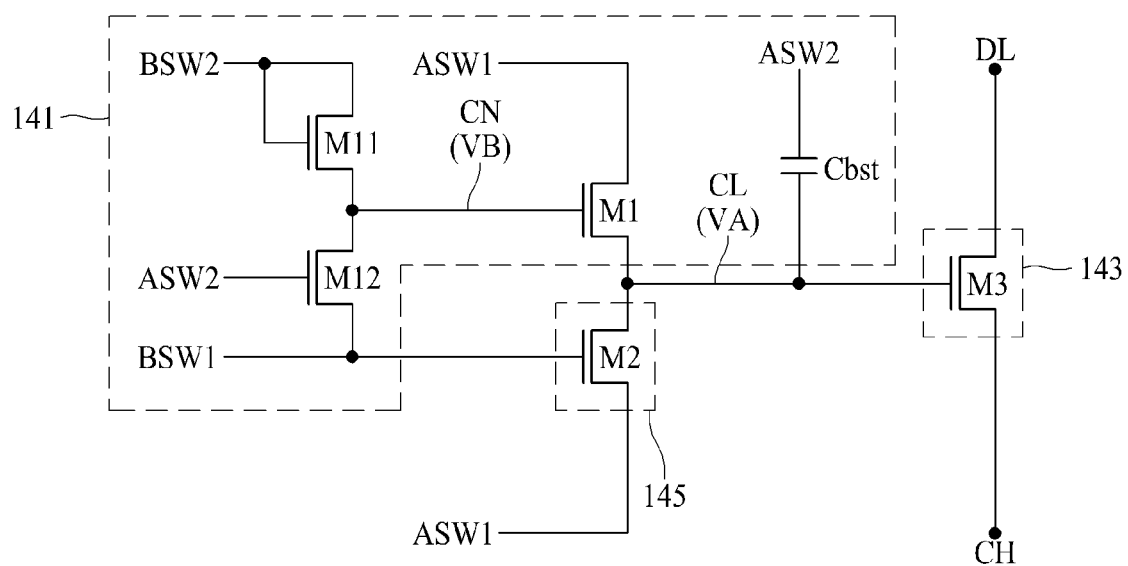
FIG. 2 is a circuit view briefly illustrating an example of a demultiplexing circuit portion shown in FIG. 1 according to one embodiment of the present disclosure.

FIG. 2 is a circuit view briefly illustrating an example of a demultiplexing circuit portion shown in FIG. 1.

Referring to FIG. 2, the demultiplexing circuit portion 140 may include a voltage controller 141, a switching portion 143 and a voltage discharge portion 145.

The voltage controller 141 may control a voltage VA of a control line CL in response to time-division control signals ASW1 and BSW1 and auxiliary signals ASW2 and BSW2 partially overlapped with the time-division control signals ASW1 and BSW1. The voltage controller 141 may increase the voltage VA of the control line CL based on the auxiliary signals ASW2 and BSW2. For example, the voltage controller 141 may drive the voltage VA of the control line CL at a voltage higher than those of the time-division control signals ASW1 and BSW1 by bootstrapping the voltage VA of the control line CL based on the auxiliary signals ASW2 and BSW2, whereby the output of the demultiplexing circuit portion 140 may stably be maintained.

The voltage controller 141 may include a first transistor M1, a charge transistor M11, a first discharge transistor M12, and a capacitor Cbst.

The first transistor M1 may be turned on based on a voltage VB of a charge node CN controlled by the first auxiliary signal ASW2 and the second auxiliary signal BSW2 to supply the first time-division control signal ASW1 to the control line CL. In detail, a gate electrode of the first transistor M1 may be connected with the charge node CN, a drain electrode of the first transistor M1 may receive the first time-division control signal ASW1, and a source electrode of the first transistor M1 may be connected with the control line CL. Therefore, if the voltage VB of the charge node CN and the first time-division control signal ASW1 correspond to a high potential voltage, the voltage VA of the control line CL may maintain the high potential voltage.

The voltage VB of the charge node CN may be charged by the charge transistor M11, and may be discharged by the first discharge transistor M12. Also, if the voltage VB of the charge node CN corresponds to the high potential voltage and the first time-division control signal ASW1 of the high potential voltage is applied to the control line CL, the voltage VB of the charge node CN may additionally be increased by gate-source capacitance of the first transistor M1. That is, the voltage VB of the charge node CN may be bootstrapped as much as the voltage of the control line CL, which is increased by the gate-source capacitance of the first transistor M1. At this time, if the voltage VB of the charge node CN is bootstrapped, the control line CL may be pre-charged to enhance charging of the control line CL, whereby the output of the demultiplexing circuit portion 140 may stably be maintained. Therefore, the demultiplexing circuit portion 140 may control the voltage VB of the charge node CN through the charge transistor M11 and the first discharge transistor M12 to improve charging characteristic of the control line CL even in the case that the first to third transistors M1, M2 and M3 are degraded and prevent an off current transferred to an organic light emitting diode from being generated. As a result, the demultiplexing circuit portion 140 may stably maintain the output of the third transistor M3 turned on based on the voltage VA of the control line CL to prevent luminance of the display panel from being deteriorated and embody an image of high resolution of the display panel.

The charge transistor M11 may be turned on based on the second auxiliary signal BSW2 partially overlapped with the second time-division control signal BSW1 to supply the second auxiliary signal BSW2 to the discharge node CN. In detail, a drain electrode and a gate electrode of the charge transistor M11 may receive the second auxiliary signal BSW2, and a source electrode of the charge transistor M11 may be connected with the charge node CN. Therefore, if the second auxiliary signal BSW2 is applied to the charge transistor M11, the charge transistor M11 may charge the voltage VB of the charge node CN. In this way, the charge transistor M11 may enhance charging of the control line CL by charging the voltage of the charge node CN before the first time-division control signal ASW1 of the high potential voltage is applied to the drain electrode of the first transistor M1, whereby the output of the demultiplexing circuit 140 may stably be maintained and a pixel charging rate may be enhanced.

The first discharge transistor M12 may be turned on based on the first auxiliary signal ASW2 partially overlapped with the first time-division control signal ASW1 to discharge the voltage VB of the charge node CN. In detail, a gate electrode of the first discharge transistor M12 may receive the first auxiliary signal ASW2, a drain electrode of the first discharge transistor M12 may be connected with the charge node CN, and a source electrode of the first discharge transistor M12 may receive the second time-division control signal BSW1. At this time, since the first auxiliary signal ASW2 and the second auxiliary signal BSW2 are applied at their respective timings different from each other, if the first auxiliary signal ASW2 corresponds to the high potential voltage, the second auxiliary signal BSW2 may correspond to a low potential voltage. For example, if the first auxiliary signal ASW2 of the high potential voltage is applied to the gate electrode of the first discharge transistor M12, the first discharge transistor M12 may be turned on, and if the second time-division control signal BSW1 of the low potential voltage is applied to the source electrode of the first discharge transistor M12, the voltage VB of the charge node CN may be discharged.

The capacitor Cbst may increase the voltage VA of the control line CL based on the first auxiliary signal ASW2 partially overlapped with the first time-division control signal ASW1. In detail, one end of the capacitor Cbst may receive the first auxiliary signal ASW2, and the other end of the capacitor Cbst may be connected with the control line CL. In this case, a first transition time of the first auxiliary signal ASW2 may correspond to a time between a first transition time and a second transition time of the first time-division control signal ASW1. That is, after the first transistor M1 is turned based on the voltage VB of the charge node CN and then the first time-division control signal ASW1 is supplied to the control line CL, the first auxiliary signal ASW2 may be applied to one end of the capacitor Cbst. In this way, after the first time-division control signal ASW1 of the high potential voltage is applied to the control line CL, the voltage VA of the control line CL may be bootstrapped based on the first auxiliary signal ASW2 of the high potential voltage, whereby the voltage controller 141 may stably maintain the output of the demultiplexing circuit portion 140. Meanwhile, if supply of the first auxiliary signal ASW2 supplied to one end of the capacitor Cbst is stopped, the voltage VA of the control line CL may return to a voltage prior to bootstrapping.

The switching portion 143 may supply the data signals supplied from the data driving circuit portion 120 to at least two kinds of data lines DL based on the voltage VA of the control line CL in due order. The switching portion 143 may include a third transistor M3.

The third transistor M3 may be turned on based on the voltage VA of the control line CL to sequentially supply the data signals received from an output channel CH of the driving integrated circuit 123 to at least two kinds of data lines DL. In detail, a gate electrode of the third transistor M3 may be connected with the control line CL, a drain electrode of the third transistor M3 may be connected with the output channel CH of the driving integrated circuit 123, and a source electrode of the third transistor M3 may be connected with the data line DL. Therefore, the third transistor M3 may be turned on while the control line CL has a high potential voltage by means of the first time-division control signal ASW1 and is bootstrapped by the first auxiliary signal ASW2, thereby sequentially supplying the data signals to at least two kinds of data lines DL.

According to one example, the third transistor M3 may be turned on from the first transition time of the first time-division control signal ASW1 to a first transition time of a second time-division control signal BSW1 spaced apart from the first time-division control signal ASW1, thereby sequentially supplying the data signals to at least two kinds of data lines. In detail, since the control line CL is charged by the first transistor M1 from an applying time of the first time-division control signal ASW1 and discharged by the second transistor M2 from an applying time of the second time-division control signal BSW1, the third transistor M3 may be turned on from the first transition time of the first time-division control signal ASW1 to the first transition time of the second time-division control signal BSW1.

The voltage discharge portion 145 may discharge the voltage VA of the control line CL in response to the time-division control signals ASW1 and BSW1. In detail, the voltage discharge portion 145 may include a second transistor M2.

The second transistor M2 may be turned on based on the second time-division control signal BSW1 spaced apart from the first time-division control signal ASW1 to discharge the voltage VA of the control line CL. In detail, a gate electrode of the second transistor M2 may receive the second time-division control signal BSW1, a drain electrode of the second transistor M2 may be connected with the control line CL and a source electrode of the second transistor M2 may receive the first time-division control signal ASW1. At this time, the first time-division control signal ASW1 and the second time-division control signal BSW1 are applied at their respective timings different from each other, if the second time-division control signal BSW1 corresponds to a high potential voltage, the first time-division control signal ASW1 may correspond to the low potential voltage. Therefore, if the second time-division control signal BSW1 of the high potential voltage is applied to the gate electrode of the second transistor M2, the second transistor M2 may be turned on, and since the first time-division control signal ASW1 of the low potential voltage is applied to the source electrode of the second transistor M2, the voltage of the control line CL may be discharged.

Figure 3:
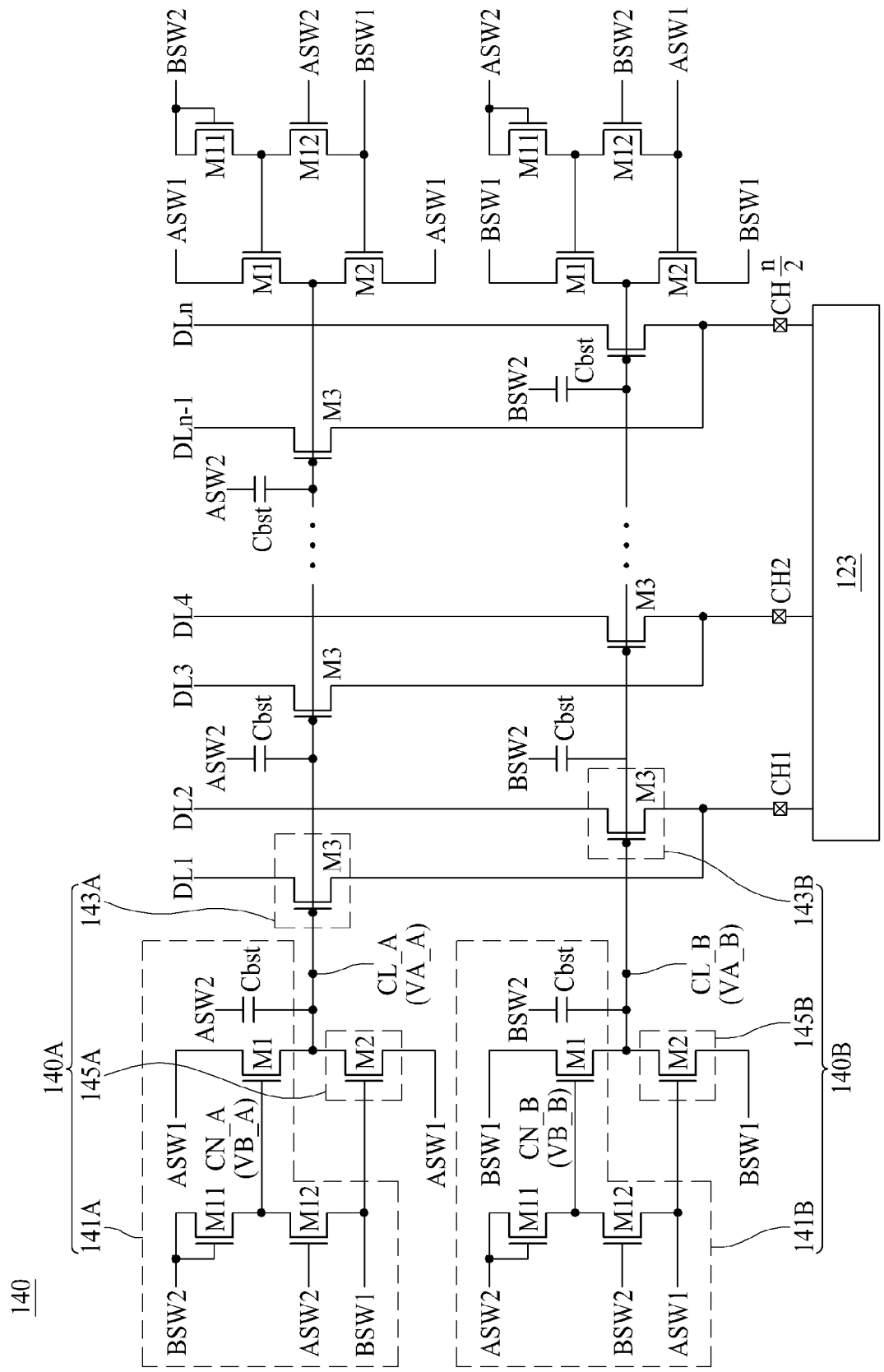
FIG. 3 is a circuit view illustrating that a demultiplexing circuit portion shown in FIG. 2 drives two kinds of data lines from one output channel according to one embodiment of the present disclosure.
Figure 4:
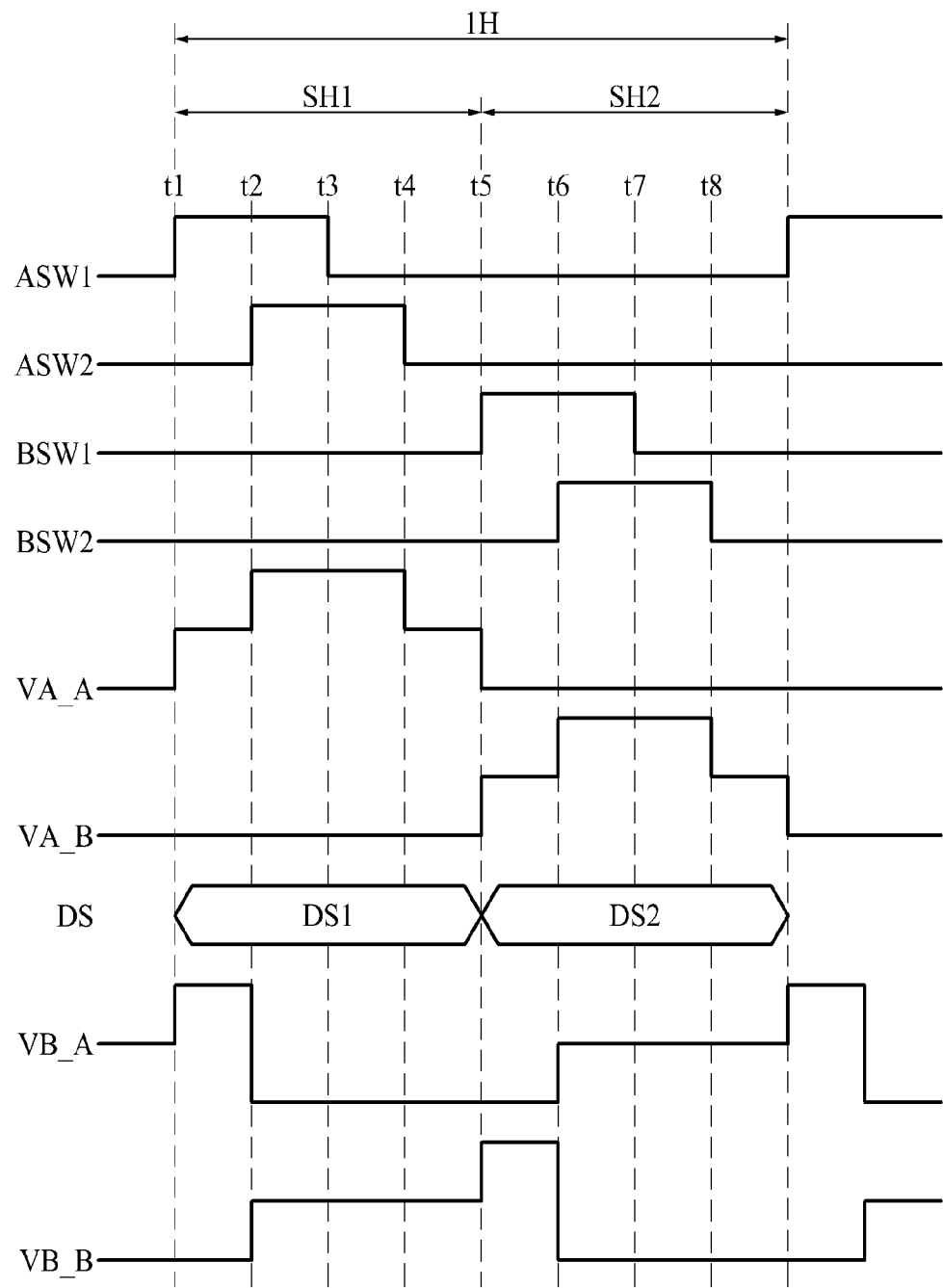
FIG. 4 is a waveform of signals supplied to a demultiplexing circuit portion shown in FIG. 3 according to one embodiment of the present disclosure.

FIG. 3 is a circuit view illustrating that a demultiplexing circuit portion shown in FIG. 2 drives two kinds of data lines from one output channel, and FIG. 4 is a waveform of signals supplied to a demultiplexing circuit portion shown in FIG. 3.

Referring to FIGS. 3 and 4, if the demultiplexing circuit portion 140 is connected with two control lines CL_A and CL_B and connected with n data lines DL, the plurality of driving integrated circuits 123 of the data driving circuit portion 120 may have n/2 output channels CH. Therefore, as the display apparatus comprises the demultiplexing circuit portion 140 connected with two control lines CL_A and CL_B, image of high resolution may be embodied while the number of output channels CH of the plurality of driving integrated circuits 123 may be reduced to ½ as compared with the display apparatus that does not comprise the demultiplexing circuit portion 140.

The demultiplexing circuit portion 140 may include a first circuit portion 140A that includes a first voltage controller 141A, a first switching portion 143A and a first voltage discharge portion 145A, which are connected with a first control line CL_A, and a second circuit portion 140B that includes a second voltage controller 141B, a second switching portion 143B and a second voltage discharge portion 145B, which are connected with a second control line CL_B.

The first transistor M1 of the first voltage controller 141A may be turned on based on a voltage VB_A of a first charge node CN_A controlled by the first auxiliary signal ASW2 and the second auxiliary signal BSW2 to supply the first time-division control signal ASW1 to the first control line CL_A. In this case, the voltage VB_A of the first charge node CN_A may be charged by the charge transistor M11 and discharged by the first discharge transistor M12. In detail, the charge transistor M11 of the first voltage controller 141A may be turned on based on the second auxiliary signal BSW2 to supply the second auxiliary signal BSW2 to the first charge node CN_A, and the first discharge transistor M12 of the first voltage controller 141A may be turned on based on the first auxiliary signal ASW2 to discharge the voltage VB_A of the first charge node CN_A. The capacitor Cbst of the first voltage controller 141A may bootstrap a voltage VA_A of the first control line CL_A based on the first auxiliary signal ASW2.

The first transistor M1 of the second voltage controller 141B may be turned on based on a voltage VB_B of a second charge node CN_B controlled by the first auxiliary signal ASW2 and the second auxiliary signal BSW2 to supply the second time-division control signal BSW1 to the second control line CL_B. In this case, the voltage VB_B of the second charge node CN_B may be charged by the charge transistor M11 and discharged by the first discharge transistor M12. In detail, the charge transistor M11 of the second voltage controller 141B may be turned on based on the first auxiliary signal ASW2 to supply the first auxiliary signal ASW2 to the second charge node CN_B, and the first discharge transistor M12 of the second voltage controller 141B may be turned on based on the second auxiliary signal BSW2 to discharge the voltage VB_B of the second charge node CN_B. The capacitor Cbst of the second voltage controller 141B may bootstrap a voltage VA_B of the second control line CL_B based on the second auxiliary signal BSW2.

In this way, the first voltage controller 141A may maintain the voltage VA_A of the first control line CL_A at a high potential voltage for a first sub horizontal period SH1 of one horizontal period 1H, and the second voltage controller 141B may maintain the voltage VA_B of the second control line CL_B at a high potential voltage for a second sub horizontal period SH2 of one horizontal period 1H.

According to one example, a first transition time t2 of the first auxiliary signal ASW2 may correspond to a time between a first transition time t1 and a second transition time t3 of the first time-division control signal ASW1, and a first transition time t6 of the second auxiliary signal BSW2 may correspond to a time between a first transition time t5 and a second transition time t7 of the second time-division control signal BSW1. In this case, a first transition time of each of a plurality of signals may correspond to, but is not limited to, a rising edge, and a second transition time thereof may correspond to, but is not limited to, a falling edge. Therefore, the voltage VA_A of the first control line CL_A may primarily be increased at the time t1 when the first time-division control signal ASW1 is applied, and may secondarily be increased by bootstrapping at a time t2 when the first auxiliary signal ASW2 is applied. Also, the voltage VA_B of the second control line CL_B may primarily be increased at the time t5 when the second time-division control signal BSW1 is applied, and may secondarily be increased by bootstrapping at a time t6 when the second auxiliary signal BSW2 is applied. Meanwhile, the voltages VA_A and VA_B of each of the first and second control lines CL_A and CL_B may return to the voltages prior to bootstrapping at the second transition time t4 and t8 of each of the first and second auxiliary signals ASW2 and BSW2.

According to one example, the voltage VB_A of the first charge node CN_A may be charged from the applying time t6 of the second auxiliary signal BSW2 and bootstrapped at the applying time t1 of the first time-division control signal ASW1. Also, the voltage VB_A of the first charge node CN_A may be discharged from the applying time t2 of the first auxiliary signal ASW2. For example, after the first charge node CN_A is charged by the second auxiliary signal BSW2, if the first time-division control signal ASW1 is applied to the first control line CL_A, the voltage VB_A of the first charge node CN_A may be bootstrapped by gate-source capacitance of the first transistor M1. At this time, if the voltage VB_A of the first charge node CN_A is bootstrapped, the first control line CL_A may be pre-charged to enhance charging of the first control line CL_A, whereby the output of the demultiplexing circuit portion 140 may stably be maintained.

The third transistor M3 of the first switching portion 143A may be turned on based on the voltage VA_A of the first control line CL_A to supply a data signal DS1 supplied from the plurality of output channels CH of the driving integrated circuit 123 to a first data lines DL1, DL3, . . . , DLn−1 of two kinds of data lines corresponding to each of the plurality of output channels CH. While FIG. 3 illustrates that a data signal DS1 is supplied to a first set of data lines DL1, DL3, . . . , DLn−1, this is not limited hereto, and the data signal DS1 can be supplied any set or combination of data lines in among the plurality of data lines DL.

According to one example, the third transistor M3 of the first switching portion 143A may be turned on from the first transition time t1 of the first time-division control signal ASW1 to the first transition time t5 of the second time-division control signal BSW1 to supply the data signal DS1 to the first data lines DL1, DL3, . . . , DLn−1 of two kinds of data lines DL. In detail, since the first control line CL_A is charged by the first transistor M1 from an applying time t1 of the first time-division control signal ASW1 and discharged by the second transistor M2 from an applying time t5 of the second time-division control signal BSW1, the third transistor M3 may be turned on from the first transition time t1 of the first time-division control signal ASW1 to the first transition time t5 of the second time-division control signal BSW1.

The third transistor M3 of the second switching portion 143B may be turned on based on the voltage VA_B of the second control line CL_B to supply a data signal DS2 supplied from the plurality of output channels CH of the driving integrated circuit 123 to second data lines DL2, DL4, . . . , DLn of two kinds of data lines corresponding to each of the plurality of output channels CH. While FIG. 3 illustrates that a data signal DS2 is supplied to a first set of data lines DL2, DL4, . . . , DLn, this is not limited hereto, and the data signal DS2 can be supplied any set or combination of data lines in among the plurality of data lines DL.

In this way, the first switching portion 143A may be turned on for the first sub horizontal period SH1 of one horizontal period 1H to supply the data signal DS1 to the first data lines DL1, DL3, . . . , DLn−1 of two kinds of data lines DL corresponding to each of the plurality of output channels CH, and the second switching portion 143B may be turned on for the second sub horizontal period SH2 of one horizontal period 1H to supply the data signal DS2 to the second data lines DL2, DL4, . . . , DLn of two kinds of data lines DL corresponding to each of the plurality of output channels CH. Therefore, as the display apparatus comprises the demultiplexing circuit portion 140 connected with two control lines CL_A and CL_B, image of high resolution may be embodied while the number of output channels CH of the plurality of driving integrated circuits 123 may be reduced to ½ as compared with the display apparatus that does not comprise the demultiplexing circuit portion 140.

The second transistor M2 of the first voltage discharge portion 145A may be turned on based on the second time-division control signal BSW1 to discharge the voltage VA_A of the first control line CL_A.

The second transistor M2 of the second voltage discharge portion 145B may be turned on based on the first time-division control signal ASW1 to discharge the voltage VA_B of the second control line CL_B.

As described above, the second transistor M2 of the first voltage discharge portion 145A may be turned on at time t5 when the first sub horizontal period SH1 of one horizontal period 1H ends or the second sub horizontal period SH2 starts, to discharge the voltage VA_A of the first control line CL_A.

According to one example, the first transistor M1, the charge transistor M11 and the first discharge transistor M12 of the voltage controller 141 and the second transistor M2 of the voltage discharge portion 145 may be arranged at each of both ends of the control line CL, and one control line CL may be connected with a plurality of capacitors Cbst and a plurality of switching portions 143. In this case, the voltage controller 141 may control the voltage VB of the charge node CN through the charge transistor M11 and the first discharge transistor M12 to improve charging characteristic of the control line CL. In this way, the first transistor M1, the charge transistor M11, the first discharge transistor M12 and the second transistor M2, which are arranged at each of both ends of the control line CL, may turn on or turn off the plurality of switching portions 143 connected with the control line CL by charging or discharging the voltage VA of the control line CL.

Figure 5:
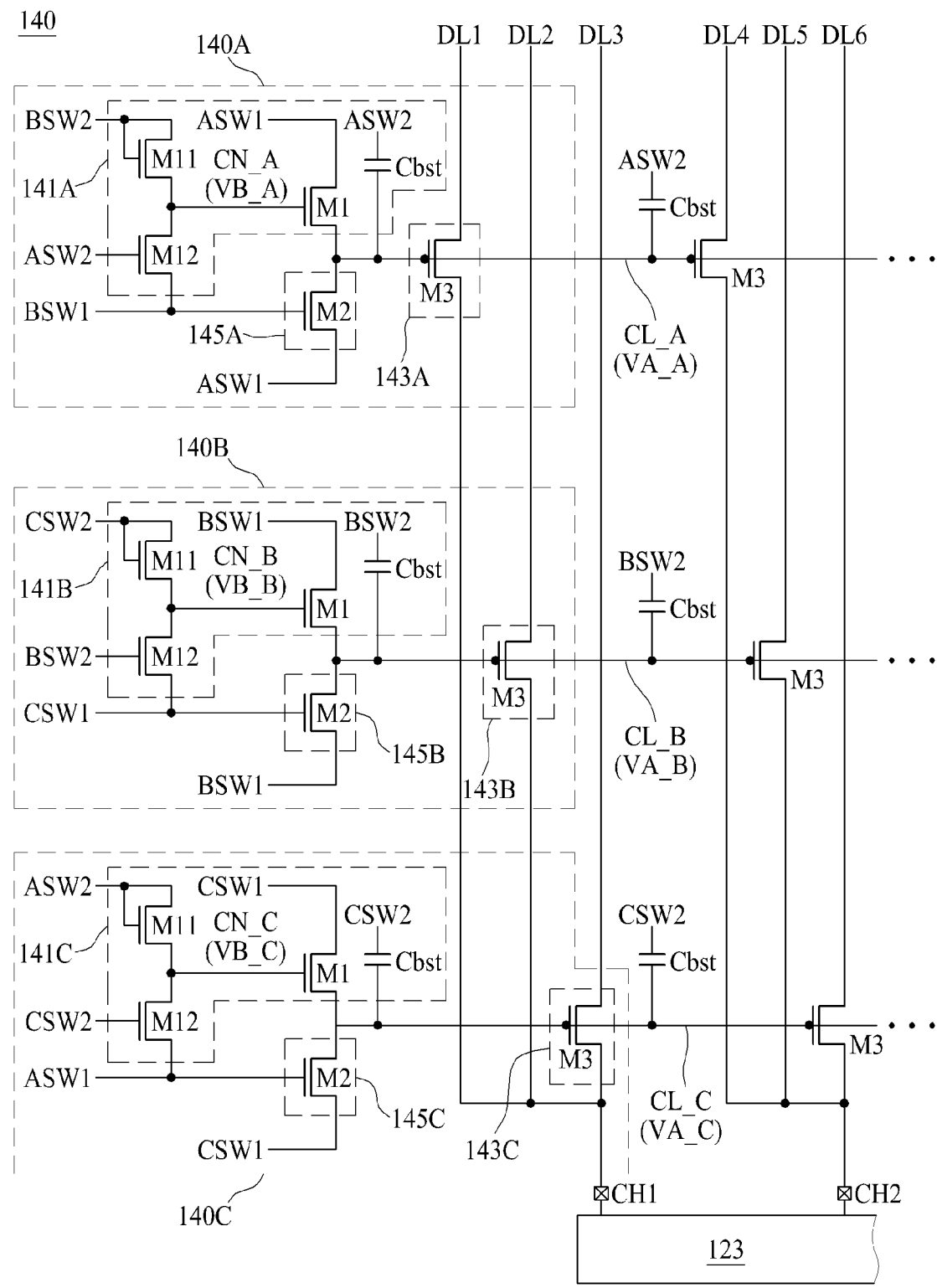
FIG. 5 is a circuit view illustrating that a demultiplexing circuit portion shown in FIG. 2 drives three kinds of data lines from one output channel according to one embodiment of the present disclosure.
Figure 6:
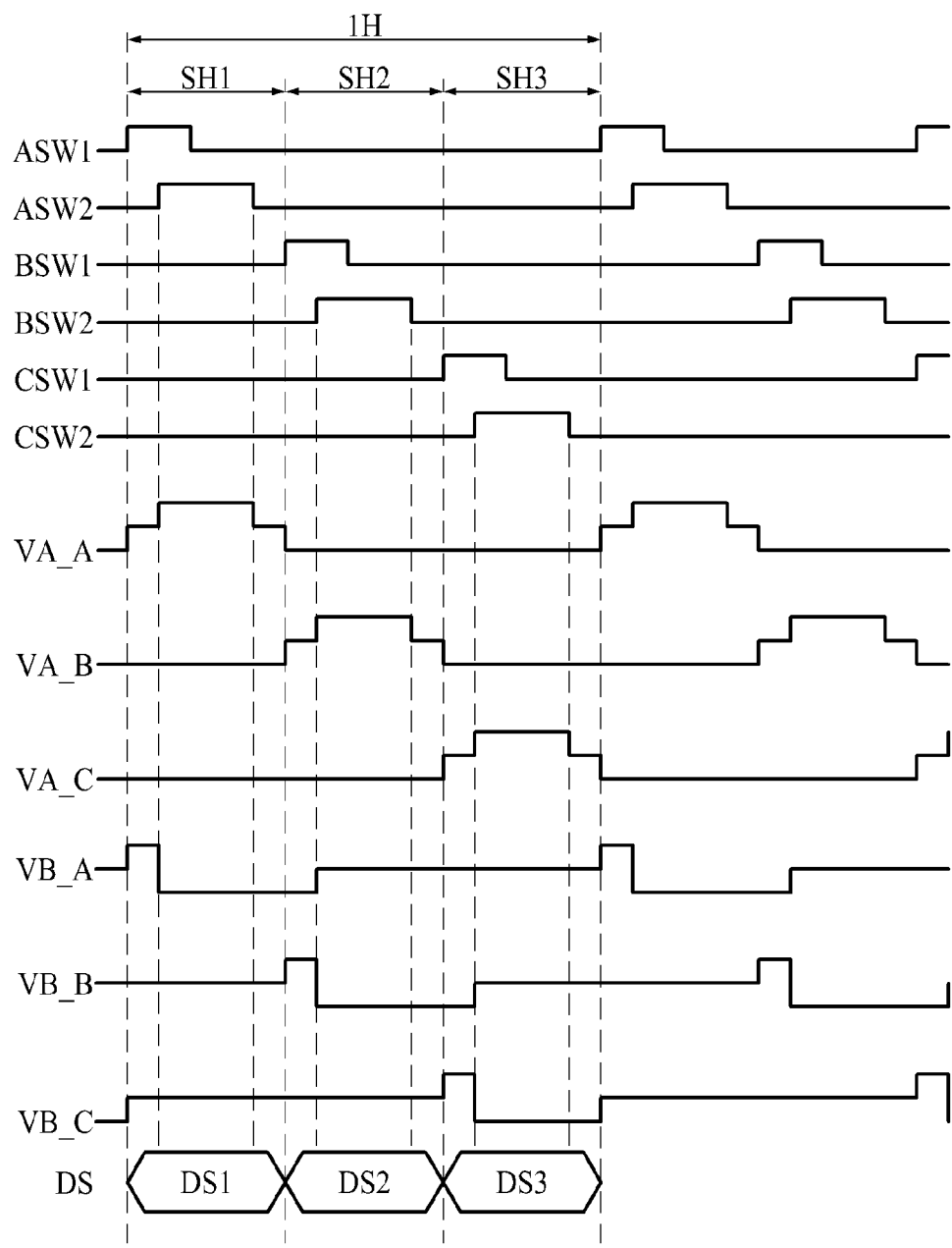
FIG. 6 is a waveform of signals supplied to a demultiplexing circuit portion shown in FIG. 5 according to one embodiment of the present disclosure.

FIG. 5 is a circuit view illustrating that a demultiplexing circuit portion shown in FIG. 2 drives three kinds of data lines from one output channel, and FIG. 6 is a waveform of signals supplied to a demultiplexing circuit portion shown in FIG. 5.

Referring to FIGS. 5 and 6, if the demultiplexing circuit portion 140 is connected with three control lines CL_A, CL_B and CL_C and connected with n data lines DL, the plurality of driving integrated circuits 123 of the data driving circuit portion 120 may have n/3 output channels CH.

Therefore, as the display apparatus comprises the demultiplexing circuit portion 140 connected with three control lines CL_A, CL_B and CL_C, image of high resolution may be embodied while the number of output channels CH of the plurality of driving integrated circuits 123 may be reduced to ⅓ as compared with the display apparatus that does not comprise the demultiplexing circuit portion 140.

The demultiplexing circuit portion 140 may include a first circuit portion 140A that includes a first voltage controller 141A, a first switching portion 143A and a first voltage discharge portion 145A, which are connected with the first control line CL_A, a second circuit portion 140B that includes a second voltage controller 141B, a second switching portion 143B and a second voltage discharge portion 145B, which are connected with the second control line CL_B, and a third circuit portion 140C that includes a third voltage controller 141C, a third switching portion 143C and a third voltage discharge portion 145C, which are connected with the third control line CL_C.

The first transistor M1 of the first voltage controller 141A may be turned on based on the voltage VB_A of the first charge node CN_A controlled by the first auxiliary signal ASW2 and the second auxiliary signal BSW2 to supply the first time-division control signal ASW1 to the first control line CL_A. The charge transistor M11 of the first voltage controller 141A may be turned on based on the second auxiliary signal BSW2 to supply the second auxiliary signal BSW2 to the first charge node CN_A, and the first discharge transistor M12 of the first voltage controller 141A may be turned on the first auxiliary signal ASW2 may be turned on based on the first auxiliary signal ASW2 to discharge the voltage VB_A of the first charge node CN_A. Also, the capacitor Cbst of the first voltage controller 141A may bootstrap the voltage VA_A of the first control line CL_A based on the first auxiliary signal ASW2.

The first transistor M1 of the second voltage controller 141B may be turned on based on the voltage VB_B of the second charge node CN_B controlled by the second auxiliary signal BSW2 and the third auxiliary signal CSW2 to supply the second time-division control signal BSW1 to the second control line CL_B. The charge transistor M11 of the second voltage controller 141B may be turned on based on the third auxiliary signal CSW2 to supply the third auxiliary signal CSW2 to the second charge node CN_B, and the first discharge transistor M12 of the second voltage controller 141B may be turned on based on the second auxiliary signal BSW2 to discharge the voltage VB_B of the second charge node CN_B. Also, the capacitor Cbst of the second voltage controller 141B may bootstrap the voltage VA_B of the second control line CL_B based on the second auxiliary signal BSW2.

The first transistor M1 of the third voltage controller 141C may be turned on based on the voltage VB_C of the third charge node CN_C controlled by the first auxiliary signal ASW2 and the third auxiliary signal CSW2 to supply the third time-division control signal CSW1 to the third control line CL_C. The charge transistor M11 of the third voltage controller 141C may be turned on based on the first auxiliary signal ASW2 to supply the first auxiliary signal ASW2 to the third charge node CN_C, and the first discharge transistor M12 of the third voltage controller 141C may be turned on based on the third auxiliary signal CSW2 to discharge the voltage VB_C of the third charge node CN_C. Also, the capacitor Cbst of the third voltage controller 141C may bootstrap the voltage VA_C of the third control line CL_C based on the third auxiliary signal CSW2.

In this way, the first voltage controller 141A may maintain the voltage VA_A of the first control line CL_A at a high potential voltage for the first sub horizontal period SH1 of one horizontal period 1H, the second voltage controller 141B may maintain the voltage VA_B of the second control line CL_B at a high potential voltage for the second sub horizontal period SH2 of one horizontal period 1H, and the third voltage controller 141C may maintain the voltage VA_C of the third control line CL_C at a high potential voltage for a third sub horizontal period SH3 of one horizontal period 1H.

Therefore, the demultiplexing circuit portion 140 may control the voltage VB of the charge node CN through the charge transistor M11 and the first discharge transistor M12 to improve charging characteristic of the control line CL even in the case that the first to third transistors M1, M2 and M3 are degraded, and may prevent an off current transferred to an organic light emitting diode from occurring. As a result, the demultiplexing circuit portion 140 may stably maintain the output of the third transistor M3 turned on based on the voltage VA of the control line CL, whereby luminance of the display panel may be prevented from being deteriorated and image of high resolution of the display panel may be embodied.

The third transistor M3 of the first switching portion 143A may be turned on based on the voltage VA_A of the first control line CL_A to supply a data signal DS1 supplied from the plurality of output channels CH of the driving integrated circuit 123 to first data lines DL1, DL4, . . . , DLn−2 of three kinds of data lines corresponding to each of the plurality of output channels CH. While FIG. 3 illustrates that a data signal DS1 is supplied to a first set of data lines DL1, DL4, . . . , DLn−2, this is not limited hereto, and the data signal DS1 can be supplied any set or combination of data lines in among the plurality of data lines DL.

The third transistor M3 of the second switching portion 143B may be turned on based on the voltage VA_B of the second control line CL_B to supply a data signal DS2 supplied from the plurality of output channels CH of the driving integrated circuit 123 to second data lines DL2, DL5, . . . , DLn−1 of three kinds of data lines corresponding to each of the plurality of output channels CH. While FIG. 3 illustrates that a data signal DS2 is supplied to a second set of data lines DL2, DL5, . . . , DLn−1, this is not limited hereto, and the data signal DS2 can be supplied any set or combination of data lines in among the plurality of data lines DL.

The third transistor M3 of the third switching portion 143C may be turned on based on the voltage VA_C of the third control line CL_C to supply a data signal DS3 supplied from the plurality of output channels CH of the driving integrated circuit 123 to third data lines DL3, DL6, . . . , DLn of three kinds of data lines corresponding to each of the plurality of output channels CH. While FIG. 3 illustrates that a data signal DS3 is supplied to a first set of data lines DL3, DL6, . . . , DLn, this is not limited hereto, and the data signal DS3 can be supplied any set or combination of data lines in among the plurality of data lines DL.

In this way, the first switching portion 143A may be turned on for the first sub horizontal period SH1 of one horizontal period 1H to supply the data signal DS1 to the first data lines DL1, DL4, . . . , DLn−2 of three kinds of data lines corresponding to each of the plurality of output channels CH, the second switching portion 143B may be turned on for the second sub horizontal period SH2 of one horizontal period 1H to supply the data signal DS2 to the second data lines DL2, DL5, . . . , DLn−1 of three kinds of data lines DL corresponding to each of the plurality of output channels CH, and the third switching portion 143C may be turned on for the third sub horizontal period SH3 of one horizontal period 1H to supply the data signal DS3 to the third data lines DL3, DL6, . . . , DLn of three kinds of data lines DL corresponding to each of the plurality of output channels CH. Therefore, as the display apparatus comprises the demultiplexing circuit portion 140 connected with three control lines CL_A, CL_B and CL_C, image of high resolution may be embodied while the number of output channels CH of the plurality of driving integrated circuits 123 may be reduced to ⅓ as compared with the display apparatus that does not comprise the demultiplexing circuit portion 140.

The second transistor M2 of the first voltage discharge portion 145A may be turned on based on the second time-division control signal BSW1 to discharge the voltage VA_A of the first control line CL_A.

The second transistor M2 of the second voltage discharge portion 145B may be turned on based on the third time-division control signal CSW1 to discharge the voltage VA_B of the second control line CL_B.

The second transistor M2 of the third voltage discharge portion 145C may be turned on based on the first time-division control signal ASW1 to discharge the voltage VA_C of the third control line CL_C.

Figure 7:
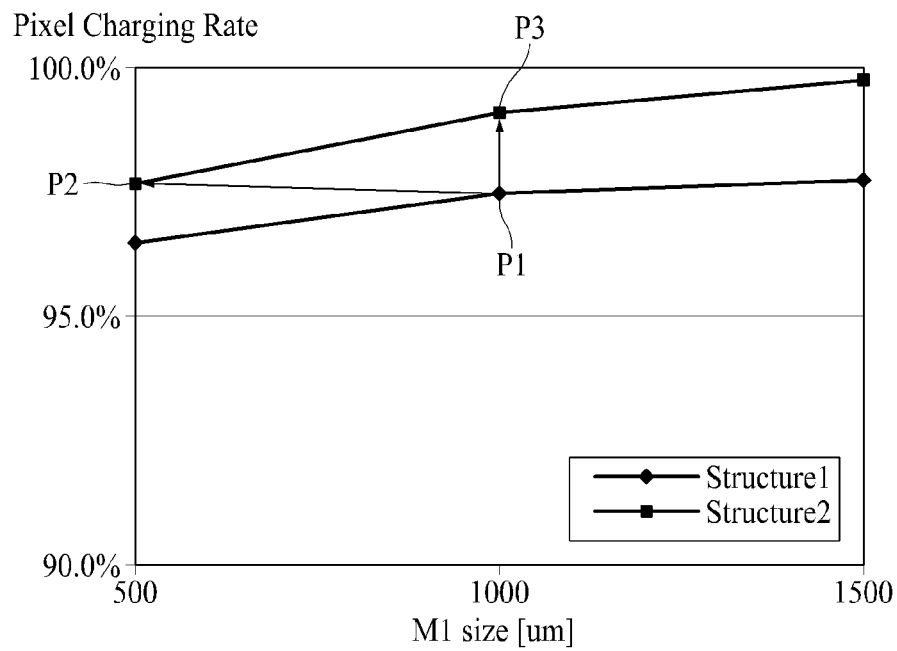
FIG. 7 is a graph illustrating charging characteristics of a demultiplexing circuit portion shown in FIG. 2 according to one embodiment of the present disclosure.

FIG. 7 is a graph illustrating a charging characteristic of a demultiplexing circuit portion shown in FIG. 2. In detail, FIG. 7 is a graph illustrating a pixel charging rate for a size of the first transistor M1. In this case, Structure 1 corresponds to the demultiplexing circuit portion 140 which does not include a charge transistor M11 and a first discharge transistor M12, and Structure 2 corresponds to a demultiplexing circuit portion 140 according to one embodiment of the present disclosure.

Referring to FIG. 7, the demultiplexing circuit portion 140 of the Structure 1 has a pixel charging rate of 96.5% when the size of the first transistor M1 is 500 μm, has a pixel charging rate of 97.5% when the size of the first transistor M1 is 1000 μm, and has a pixel charging rate of 97.6% when the size of the first transistor M1 is 1500 μm.

The demultiplexing circuit portion 140 of the Structure 2 has a pixel charging rate of 97.5% when the size of the first transistor M1 is 500 μm, has a pixel charging rate of 99% when the size of the first transistor M1 is 1000 μm, and has a pixel charging rate of 99.8% when the size of the first transistor M1 is 1500 μm.

For example, it is noted that a pixel charging rate P2 of the Structure 2 comprising the first transistor M1 having a size of 500 μm is similar to a pixel charging rate P1 of the Structure 1 comprising the first transistor M1 having a size of 1000 μm. Therefore, as the demultiplexing circuit portion 140 of the Structure 2 comprises a charge transistor M11 and a first discharge transistor M12, the demultiplexing circuit portion 140 may have a pixel charging rate similar to that of the Structure 1 even though the demultiplexing circuit portion 140 of the Structure 2 comprises the first transistor M1 having a size smaller than that of the Structure 1.

Also, it is noted that the pixel charging rate P2 of the Structure 2 comprising the first transistor M1 having a size of 1000 μm is more improved than the pixel charging rate P1 of the Structure 1 comprising the first transistor M1 having a size of 1000 μm. Therefore, as the demultiplexing circuit portion 140 of the Structure 2 comprises the charge transistor M11 and the first discharge transistor M12, the pixel charging rate may be more improved than that of the Structure 1.

Therefore, the demultiplexing circuit portion (Structure 2) 140 according to the present disclosure may control the voltage VB of the charge node CN through the charge transistor M11 and the first discharge transistor M12 to improve charging characteristic of the control line CL even in the case that the first to third transistors M1, M2 and M3 are degraded and prevent an off current transferred to an organic light emitting diode from being generated, whereby image of high resolution may be embodied.

Figure 8:
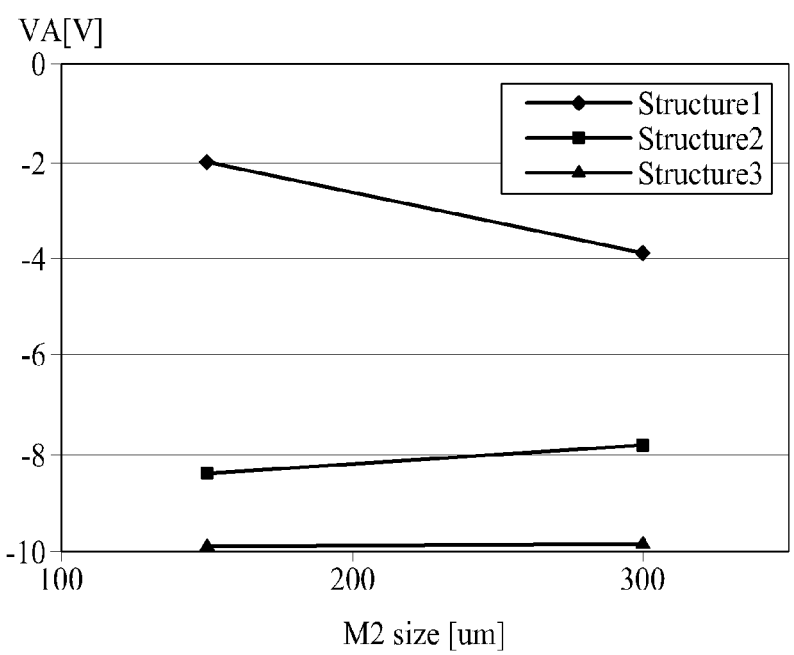
FIG. 8 is a graph illustrating discharging characteristics of a demultiplexing circuit portion shown in FIG. 2 according to one embodiment of the present disclosure.

FIG. 8 is a graph illustrating discharging characteristics of a demultiplexing circuit portion shown in FIG. 2. In detail, FIG. 8 is a graph illustrating a voltage VA of a discharged control line CL with respect to a size of the second transistor M2. In this case, a gate low voltage VGL of the discharged control line CL corresponds to −10V. Structure 1 corresponds to the demultiplexing circuit portion 140 which does not include a charge transistor M11 and a first discharge transistor M12, Structure 2 corresponds to a demultiplexing circuit portion 140 which includes a charge transistor M11 and a first discharge transistor M12 in accordance with one embodiment of the present disclosure, and Structure 3 corresponds to a demultiplexing circuit portion 140 which includes a charge transistor M11 and a first discharge transistor M12 in accordance with another embodiment of the present disclosure and includes a first transistor M1 smaller than that of the Structure 2. For example, if a size of the first transistor M1 of the Structure 1 and the Structure 2 is 1000 μm, the size of the first transistor M1 of the Structure 3 corresponds to 500m.

Referring to FIG. 8, if a size of the second transistor M2 of the Structure 1 is 150 μm, the voltage VA of the discharged control line CL corresponds to −2V, approximately, if a size of the second transistor M2 of the Structure 2 is 150 μm, the voltage VA of the discharged control line CL corresponds to −8.2V, approximately, and if a size of the second transistor M2 of the Structure 3 is 150 μm, the voltage VA of the discharged control line CL corresponds to −10V, approximately.

Also, if a size of the second transistor M2 of the Structure 1 is 300 μm, the voltage VA of the discharged control line CL corresponds to −4V, approximately, if a size of the second transistor M2 of the Structure 2 is 300 μm, the voltage VA of the discharged control line CL corresponds to −7.8V, approximately, and if a size of the second transistor M2 of the Structure 3 is 300 μm, the voltage VA of the discharged control line CL corresponds to −9.9V, approximately.

That is, as each of the Structure 2 and the Structure 3 includes the charge transistor M11 and the first discharge transistor M12, it is noted that discharging characteristic of the control line CL is more improved than the Structure 1. Also, as the Structure 3 includes the first transistor M1 smaller than the first transistor M1 of the Structure 2, it is noted that discharging characteristic of the control line CL is more improved than the Structure 2.

As described above, as the demultiplexing circuit portion (Structure 2) 140 according to one embodiment of the present disclosure may control the voltage VB of the charge node CN through the charge transistor M11 and the first discharge transistor M12, charging characteristic of the control line CL may be improved to enhance a pixel charging rate even in the case that the first to third transistors M1, M2 and M3 are degraded, whereby discharging characteristic of the control line may be improved to prevent an off current transferred to an organic light emitting diode from being generated.

Also, as the demultiplexing circuit portion (Structure 3) 140 according to another embodiment of the present disclosure may control the voltage VB of the charge node CN through the charge transistor M11 and the first discharge transistor M12 and includes the first transistor M1 smaller than that of the Structure 2, discharging characteristic of the control line CL may be more improved than that of the demultiplexing circuit portion 140 of the Structure 2.

Figure 9:
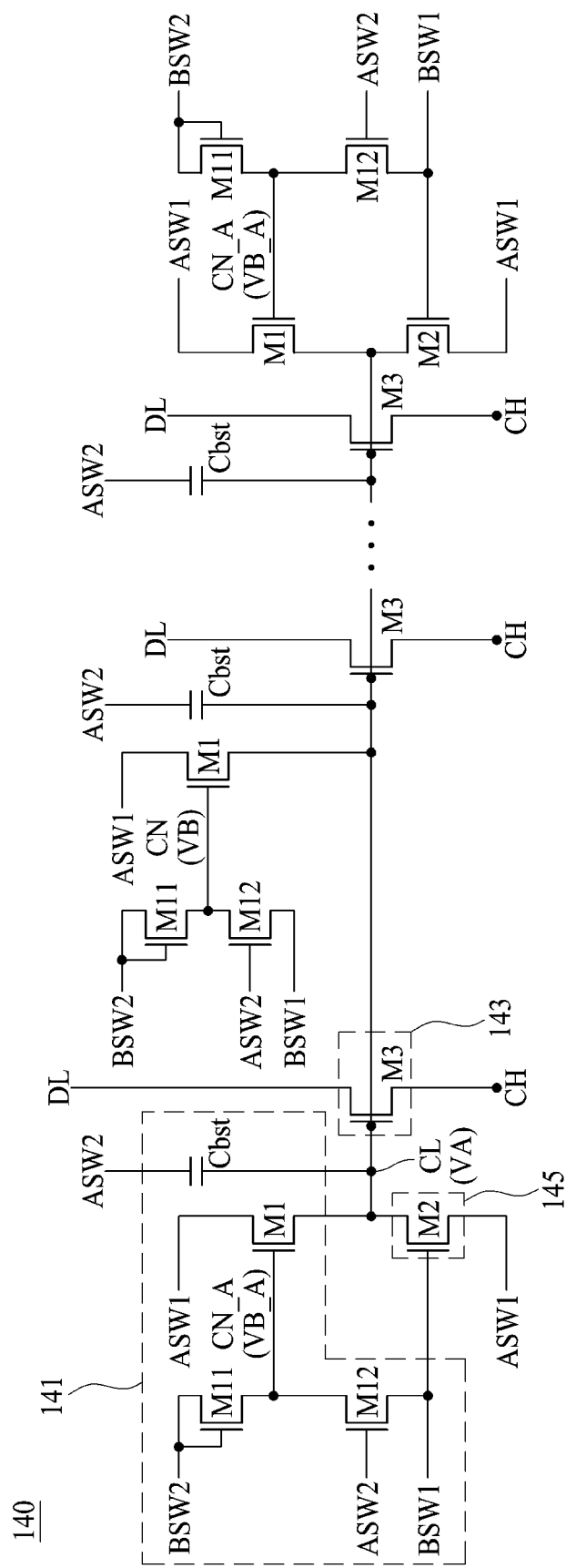
FIG. 9 is a circuit view illustrating another example of a demultiplexing circuit portion shown in FIG. 2.

FIG. 9 is a circuit view illustrating another example of a demultiplexing circuit portion shown in FIG. 2.

Referring to FIG. 9, the demultiplexing circuit portion 140 may include two first transistors M1, two charge transistors M11, two first discharge transistors M12 and two second transistors M2, which are arranged at each of both ends of one control line CL, wherein one control line CL may be connected with a plurality of capacitors Cbst and a plurality of third transistors M3. At this time, the two first transistors M1, the two charge transistors M11 and the two first discharge transistors M12, which are arranged at each of both ends of one control line CL may charge the voltage VA of the control line CL, and the two second transistors M2 arranged at each of both ends of one control line CL may discharge the voltage VA of the control line CL. Each of the plurality of capacitors Cbst may be arranged to correspond to each of the plurality of third transistors M3, whereby the voltage VA of the control line CL may be subjected to bootstrapping.

The voltage controller 141 of the demultiplexing circuit portion 140 may further include p number of first transistors M1 (p is a natural number of 1 to (n/i−2)) turned on based on the voltage VB of the charge node controlled by a kth auxiliary signal and a k+1th auxiliary signal to supply the kth time-division control signal to a kth control line.

The voltage controller 141 may further include p charge transistors M11 turned on based on the k+1th auxiliary signal to supply the k+1th auxiliary signal to the charge node CN connected with the gate electrode of each of the p number of first transistors M1, and may further include p number of first discharge transistors M12 turned on based on the kth auxiliary signal to discharge the voltage VB of the charge node CN connected with the gate electrode of each of the p number of first transistors M1. For example, the first transistor M1, the charge transistor M11 and the first discharge transistor M12 may be provided in one set to control the voltage VB of the charge node CN connected with the gate electrode of the first transistor M1.

In this way, the voltage controller 141 includes additional first transistor M1, charge transistor M11 and first discharge transistor M12 separately from the two first transistors M1, the two charge transistors M11 and the two first discharge transistors M12, which are arranged at each of both ends of one control line CL, whereby charging characteristics of the control line CL may be enhanced and therefore the voltage VA of the control line CL may stably be maintained.

According to one example, the voltage controller 141 of the demultiplexing circuit portion 140 may further include a set of a first transistor M1, a charge transistor M11 and a first discharge transistor M12 by grouping a plurality of capacitors Cbst and a plurality of third transistors M3 in a predetermined unit to correspond to each of the plurality of groups. For example, if the display apparatus includes n data lines DL1 to DLn and the demultiplexing circuit portion 140 is connected with three control lines CL_A, CL_B and CL_C, since one control line CL is connected with n/3 data lines DL, the demultiplexing circuit portion 140 may include n/3 third transistors M3 connected with one control line CL. At this time, the demultiplexing circuit portion 140 may further include n/30 first transistors M1, a charge transistor M11 and a first discharge transistor M12 by grouping a plurality of capacitors Cbst and a plurality of third transistors M3 in a unit of 10 capacitors Cbst and 10 third transistors M3. In this way, the voltage controller 141 of the demultiplexing circuit portion 140 may further include a first transistor M1, a charge transistor M11 and a first discharge transistor M12, which correspond to each of a plurality of groups of a plurality of capacitors Cbst and a plurality of third transistors M3, whereby charging characteristic may be improved in all areas of the control line CL and therefore the voltage VA of the control line CL may stably be maintained.

According to another example, the voltage controller 141 of the demultiplexing circuit portion 140 may include a first transistor M1, a charge transistor M11 and a first discharge transistor M12, which correspond to each of a plurality of capacitors Cbst and a plurality of third transistors M3. For example, if the display apparatus includes n data lines DL1 to DLn and the demultiplexing circuit portion 140 is connected with three control lines CL_A, CL_B and CL_C, since one control line CL is connected with n/3 data lines DL, the voltage controller 141 of the demultiplexing circuit portion 140 may include n/3 first transistors M1, charge transistors M11 and first discharge transistors M12 including a first transistor M1, a charge transistor M11 and a first discharge transistor M12, which are arranged at each of both ends of the control line CL.

The description of the demultiplexing circuit portion 140 according to one example and another example is only exemplary, and is not limited to the number of the transistors. Therefore, the voltage controller 141 of the demultiplexing circuit portion 140 may improve charging characteristic in all areas of the control line CL and control the number of the first transistors M1, the charge transistors M11 and the first discharge transistors M12 within the range that does not need excessive cost.

Figure 10:
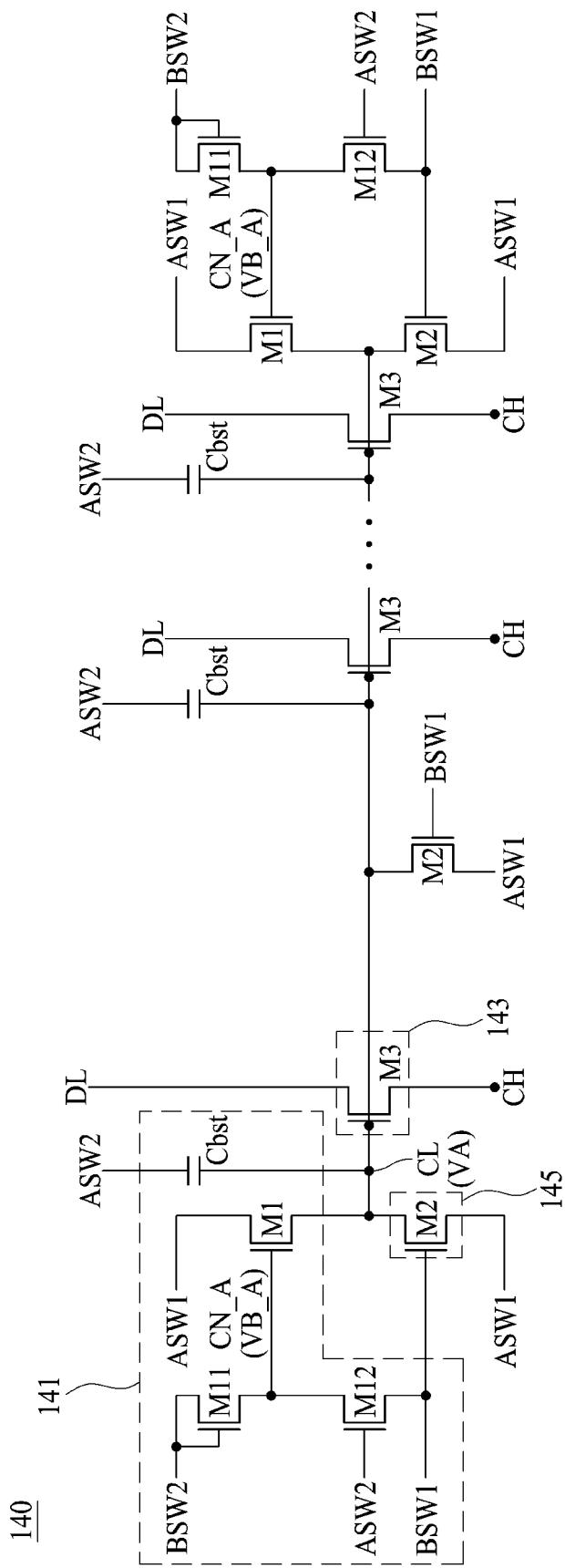
FIG. 10 is a circuit view illustrating still another example of a demultiplexing circuit portion shown in FIG. 2.

FIG. 10 is a circuit view illustrating still another example of a demultiplexing circuit portion shown in FIG. 2.

Referring to FIG. 10, the demultiplexing circuit portion 140 may include two first transistors M1, two charge transistors M11, two first discharge transistors M12 and two second transistors M2, which are arranged at each of both ends of one control line CL, wherein one control line CL may be connected with a plurality of capacitors Cbst and a plurality of third transistors M3. At this time, the two first transistors M1, the two charge transistors M11 and the two first discharge transistors M12, which are arranged at each of both ends of one control line CL may charge the voltage VA of the control line CL, and the two second transistors M2 arranged at each of both ends of one control line CL may discharge the voltage VA of the control line CL. Each of the plurality of capacitors Cbst may be arranged to correspond to each of the plurality of third transistors M3, whereby the voltage VA of the control line CL may be subjected to bootstrapping.

The voltage discharge portion 145 of the demultiplexing circuit portion 140 may further include p number of second transistors M2 (p is a natural number of 1 to (n/i−2)) turned on based on a k+1th time-division control signal to discharge a kth control line CL. In detail, the voltage discharge portion 145 may include additional second transistor M2 separately from the two second transistors M2 arranged at each of both ends of one control line CL, whereby discharging characteristic of the control line CL may be improved and therefore an off current transferred to an organic light emitting diode may be prevented from occurring.

According to one example, the voltage discharge portion 145 of the demultiplexing circuit portion 140 may further include a second transistor M2 by grouping a plurality of capacitors Cbst and a plurality of third transistors M3 in a predetermined unit to correspond to each of the plurality of groups. For example, if the display apparatus includes n data lines DL1 to DLn and the demultiplexing circuit portion 140 is connected with three control lines CL_A, CL_B and CL_C, since one control line CL is connected with n/3 data lines DL, the demultiplexing circuit portion 140 may include n/3 third transistors M3 connected with one control line CL. At this time, the demultiplexing circuit portion 140 may further include n/30 second transistors M2 by grouping a plurality of capacitors Cbst and a plurality of third transistors M3 in a unit of 10 capacitors Cbst and 10 third transistors M3. In this way, the voltage discharge portion 145 of the demultiplexing circuit portion 140 may further include a second transistor M2 corresponding to a plurality of groups of a plurality of capacitors Cbst and a plurality of third transistors M3, whereby discharging characteristic may be improved in all areas of the control line CL to overcome a limitation caused by degradation of the second transistor M2 and therefore an off current capable of being transferred to an organic light emitting diode may be prevented from occurring.

According to another example, the voltage discharge portion 145 of the demultiplexing circuit portion 140 may include a second transistor M2 corresponding to each of a plurality of capacitors Cbst and a plurality of third transistors M3. For example, if the display apparatus includes n data lines DL1 to DLn and the demultiplexing circuit portion 140 is connected with three control lines CL_A, CL_B and CL_C, since one control line CL is connected with n/3 data lines DL, the voltage discharge portion 145 of the demultiplexing circuit portion 140 may include n/3 second transistors M2 including a second transistor M2 arranged at each of both ends of the control line CL.

The description of the demultiplexing circuit portion 140 according to one example and another example is only exemplary, and is not limited to the number of the transistors. Therefore, the voltage discharge portion 145 of the demultiplexing circuit portion 140 may improve discharging characteristic in all areas of the control line CL and control the number of the second transistors M2 within the range that does not need excessive cost.

Figure 11:
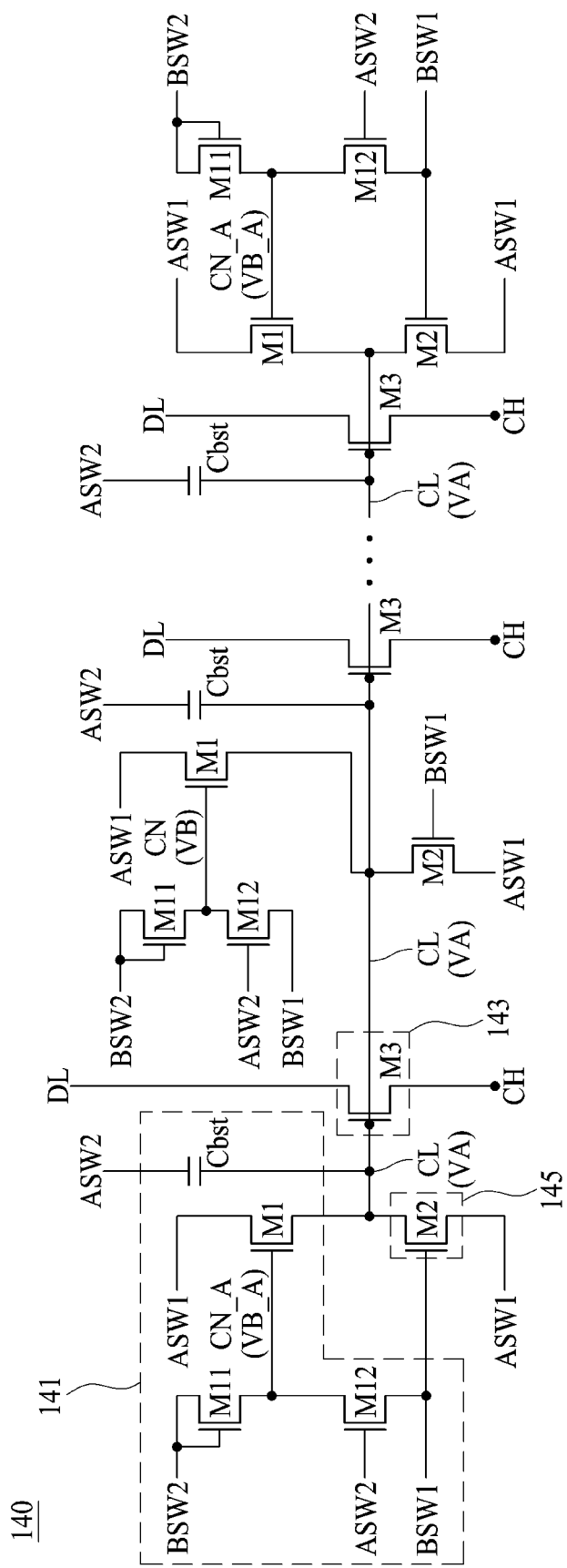
FIG. 11 is a circuit view illustrating further still another example of a demultiplexing circuit portion shown in FIG. 2.

FIG. 11 is a circuit view illustrating further still another example of a demultiplexing circuit portion shown in FIG. 2.

Referring to FIG. 11, the demultiplexing circuit portion 140 may include two first transistors M1, two charge transistors M11, two first discharge transistors M12, and two second transistors M2, which are arranged at each of both ends of one control line CL, wherein one control line CL may be connected with a plurality of capacitors Cbst and a plurality of third transistors M3.

The voltage controller 141 may further include p number of first transistors M1 (p is a natural number of 1 to (n/i−2)) turned on based on the voltage VB of the charge node CN controlled by the kth auxiliary signal and the k+1th auxiliary signal to supply the kth time-division control signal to the kth control line. The voltage controller 141 may further include p charge transistors M11 turned on based on the k+1th auxiliary signal to supply the k+1th auxiliary signal to the charge node CN connected with the gate electrode of each of the p number of first transistors M1, and may further include p number of first discharge transistors M12 turned on based on the kth auxiliary signal to discharge the voltage VB of the charge node CN connected with the gate electrode of each of the p number of first transistors M1. Also, the voltage discharge portion 145 may further include p number of second transistors M2 turned on based on the k+1th time-division control signal to discharge the kth control line CL. In this way, the demultiplexing circuit portion 140 may improve both charging characteristic and discharging characteristic of the control line CL.

According to one example, the demultiplexing circuit portion 140 may further include a set of a first transistor M1, a charge transistor M11, a first discharge transistor M12 and a second transistor M2 by grouping a plurality of capacitors Cbst and a plurality of third transistors M3 in a predetermined unit to correspond to each of the plurality of groups. For example, if the display apparatus includes n data lines DL1 to DLn and the demultiplexing circuit portion 140 is connected with three control lines CL_A, CL_B and CL_C, since one control line CL is connected with n/3 data lines DL, the demultiplexing circuit portion 140 may include n/3 third transistors M3 connected with one control line CL. At this time, the demultiplexing circuit portion 140 may further include a set of n/30 first transistors M1, charge transistors M11, first discharge transistors M12 and second transistor M2 by grouping a plurality of capacitors Cbst and a plurality of third transistors M3 in a unit of 10 capacitors Cbst and 10 third transistors M3. In this way, the demultiplexing circuit portion 140 may further include a set of a first transistor M1, a charge transistor M11, a first discharge transistor M12 and a second transistor M2 to correspond to each of a plurality of groups of a plurality of capacitors Cbst and a plurality of third transistors M3, whereby charging characteristic and discharging characteristic may be improved in all areas of the control line CL to stably maintain the voltage VA of the control line CL and overcome a limitation caused by degradation of the second transistor M2 and therefore an off current capable of being transferred to an organic light emitting diode may be prevented from occurring.

According to another example, the demultiplexing circuit portion 140 may include a set of a first transistor M1, a charge transistor M11, a first discharge transistor M12, and a second transistor M2 to correspond to each of a plurality of capacitors Cbst and a plurality of third transistors M3. For example, if the display apparatus includes n data lines DL1 to DLn and the demultiplexing circuit portion 140 is connected with three control lines CL_A, CL_B and CL_C, since one control line CL is connected with n/3 data lines DL, the demultiplexing circuit portion 140 may include a set of n/3 first transistors M1, charge transistors M11, first discharge transistors M12 and second transistors M2 including a set of the first transistor M1, the charge transistor M11, the first discharge transistor M12 and the second transistor M2, which are arranged at each of both ends of the control line CL.

According to one example, if the demultiplexing circuit portion 140 includes a first transistor M1, a charge transistor M11, a first discharge transistor M12 and a second transistor M2 in a plurality of sets, the demultiplexing circuit 140 may divide the kth control line CL into the number of sets of the transistors to charge and discharge the voltage VA of the divided kth control lines CL through a set of the first transistor M1, the charge transistor M11, the first discharge transistor M12, and the second transistor M2. At this time, the demultiplexing circuit portion 140 may minimize a time constant (t=RC) according to a resistor and a capacitor connected with the control line CL by dividing the control line CL. Therefore, the demultiplexing circuit portion 140 may enable high speed driving by dividing the control line CL and embody image of high resolution while reducing the number of output channels CH.

The description of the demultiplexing circuit portion 140 according to one example and another example is only exemplary, and is not limited to the number of the transistors. Therefore, the demultiplexing circuit portion 140 may improve charging characteristic and discharging characteristic in all areas of the control line CL and control the number of the first transistors M1, the charge transistors M11, the first discharge transistors M12 and the second transistors M2 within the range that does not need excessive cost.

Figure 12:
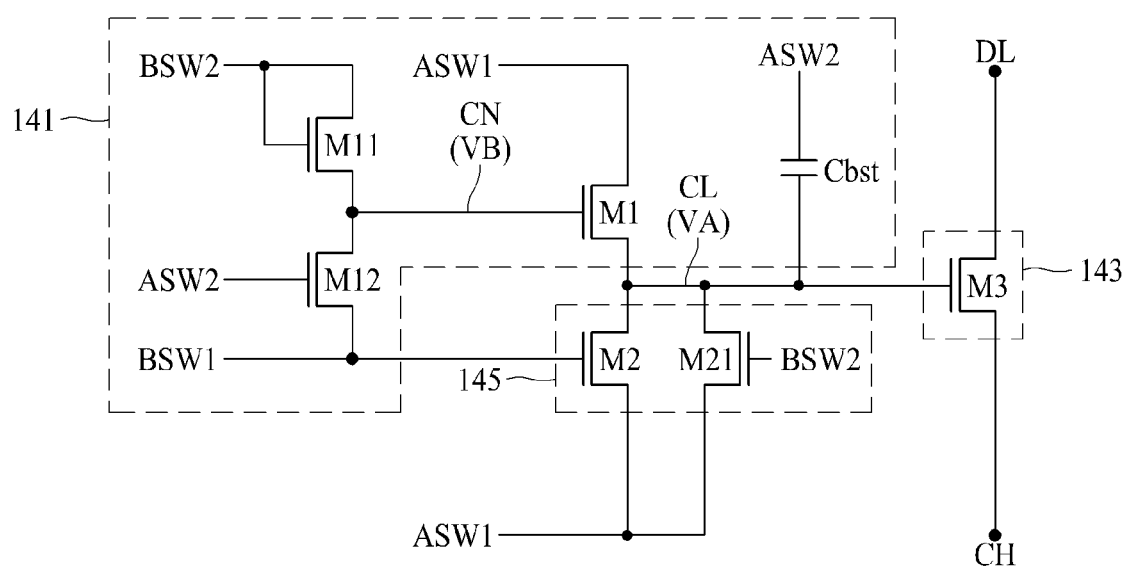
FIG. 12 is a circuit view illustrating further still another example of a demultiplexing circuit portion shown in FIG. 1.

FIG. 12 is a circuit view illustrating further still another example of a demultiplexing circuit portion shown in FIG. 1. The demultiplexing circuit portion 140 of FIG. 12 further includes a second discharge transistor M21 in the demultiplexing circuit portion of FIG. 2, and its description the same as the aforementioned description will be simplified or omitted.

Referring to FIG. 12, the demultiplexing circuit portion 140 may include a voltage controller 141, a switching portion 143 and a voltage discharge portion 145.

The voltage controller 141 may include a first transistor M1, a charge transistor M11, a first discharge transistor M12, and a capacitor Cbst.

The first transistor M1 may be turned on based on a voltage VB of a charge node CN controlled by a first auxiliary signal ASW2 and a second auxiliary signal BSW2 to supply a time-division control signal ASW1 to a control line CL.

The charge transistor M11 may be turned on based on the second auxiliary signal BSW2 partially overlapped with a second time-division control signal BSW1 to supply the second auxiliary signal BSW2 to the discharge node CN.

The first discharge transistor M12 may be turned on based on the first auxiliary signal ASW2 partially overlapped with the first time-division control signal ASW1 to discharge the voltage VB of the charge node CN.

The capacitor Cbst may increase the voltage VA of the control line CL based on the first auxiliary signal ASW2 partially overlapped with the first time-division control signal ASW1.

The switching portion 143 may supply the data signals supplied from the data driving circuit portion 120 to at least two kinds of data lines DL based on the voltage VA of the control line CL in due order. The switching portion 143 may include a third transistor M3.

The voltage discharge portion 145 may include a second transistor M2 and a second discharge transistor M21.

The second transistor M2 may be turned on based on the second time-division control signal BSW1 spaced apart from the first time-division control signal ASW1 to discharge the voltage VA of the control line CL.

The second discharge transistor M21 may be turned on based on the second auxiliary signal BSW2 partially overlapped with the second time-division control signal BSW1 to additionally discharge the voltage VA of the control line CL. In detail, a gate electrode of the second discharge transistor M21 may receive the second auxiliary signal BSW2, a drain electrode of the second discharge transistor M21 may be connected with the control line CL and a source electrode of the second discharge transistor M21 may receive the first time-division control signal ASW1. In this case, a first transition time of the second auxiliary signal BSW2 may correspond to a time between the first transition time and the second transition time of the second time-division control signal BSW1. That is, after the second time-division control signal BSW1 is applied to the gate electrode of the second transistor M2, the second auxiliary signal BSW2 may be applied to the gate electrode of the second discharge transistor M21. In this way, after the second transistor M2 primarily discharges the voltage VA of the control line CL based on the second time-division control signal BSW1, the second discharge transistor secondarily discharges the voltage VA of the control line CL based on the second auxiliary signal BSW2, whereby the voltage discharge portion 145 may improve discharging characteristic of the demultiplexing circuit portion 140 to prevent an off current transferred to an organic light emitting diode from occurring.

Figure 13:
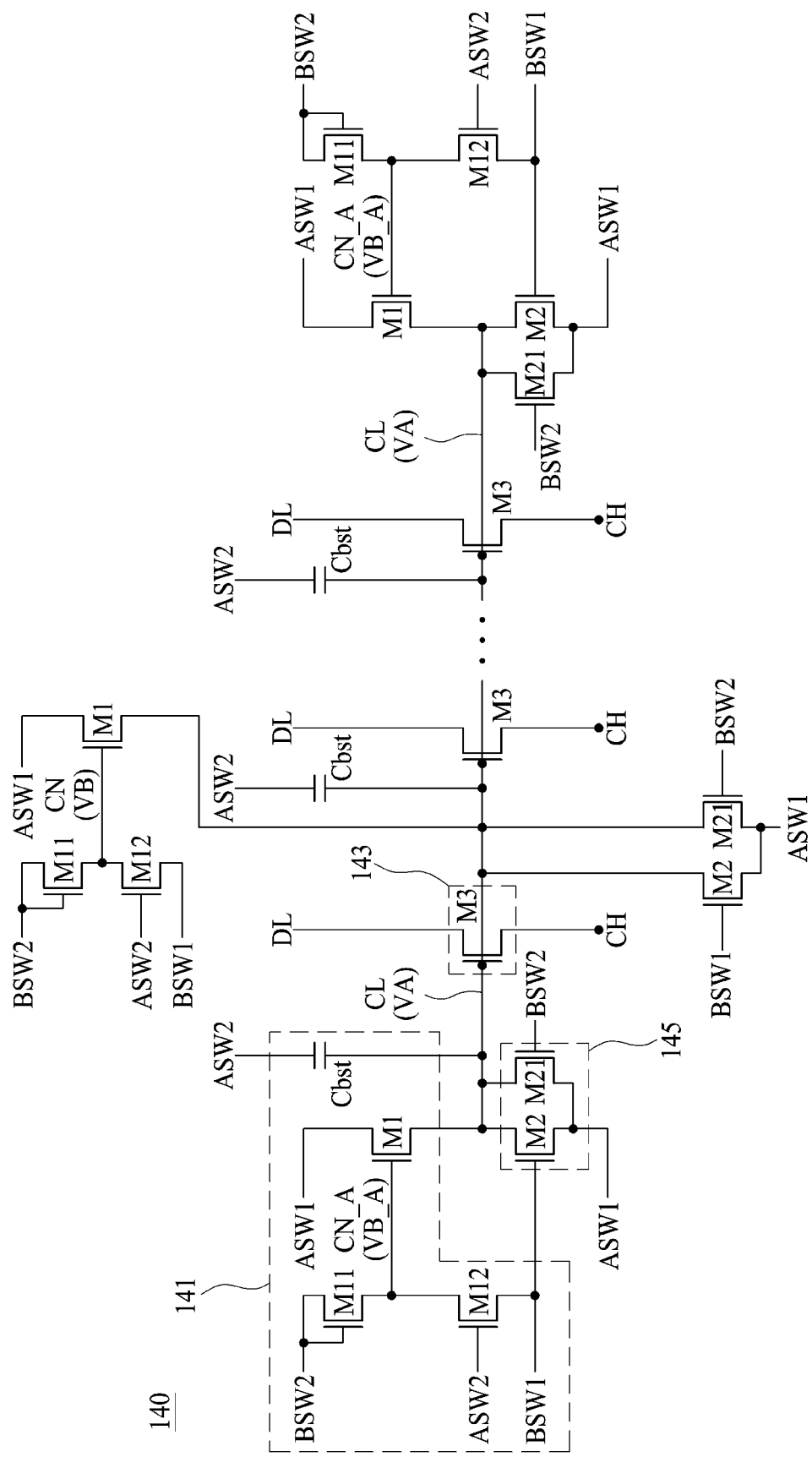
FIG. 13 is a circuit view briefly illustrating another example of a demultiplexing circuit portion shown in FIG. 12.

FIG. 13 is a circuit view briefly illustrating another example of a demultiplexing circuit portion shown in FIG. 12.

Referring to FIG. 13, the demultiplexing circuit portion 140 includes a set of a first transistor M1, a charge transistor M11, a first discharge transistor M12, and a second transistor M2, which are arranged at each of both ends of one control line CL, wherein one control line CL may be connected with a plurality of capacitors Cbst and a plurality of third transistors M3.

The voltage controller 141 may further include p number of first transistors M1 (p is a natural number of 1 to (n/i−2)) turned on based on a voltage VB of a charge node CN controlled by a kth auxiliary signal and a k+1th auxiliary signal to supply a kth time-division control signal to a kth control line. The voltage controller 141 may further include p charge transistors M11 turned on based on the k+1 th auxiliary signal to supply the k+1th auxiliary signal to the charge node CN connected with the gate electrode of each of the p number of first transistors M1, and may further include p number of first discharge transistors M12 turned on based on the kth auxiliary signal to discharge the voltage VB of the charge node CN connected with the gate electrode of each of the p number of first transistors M1.

The voltage discharge portion 145 may further include p number of second transistors M2 turned on based on the k+1th time-division control signal to discharge the kth control line CL and further include q number of second discharge transistors M21 (q is a natural number of 1 to n/i) for additionally discharging the voltage of the kth control line CL based on the k+1th auxiliary signal partially overlapped with the k+1th time-division control signal, whereby discharging characteristic may be more improved than the case that the second discharge transistor M21 is not provided.

According to one example, the demultiplexing circuit portion 140 may further include second discharge transistors M21 by grouping a plurality of capacitors Cbst and a plurality of third transistors M3 in a predetermined unit to correspond to each of the plurality of groups. For example, if the display apparatus includes n data lines DL1 to DLn and the demultiplexing circuit portion 140 is connected with three control lines CL_A, CL_B and CL_C, since one control line CL is connected with n/3 data lines DL, the demultiplexing circuit portion 140 may include n/3 third transistors M3 connected with one control line CL. At this time, the demultiplexing circuit portion 140 may further include n/30 second discharge transistors M21 by grouping a plurality of capacitors Cbst and a plurality of third transistors M3 in a unit of 10 capacitors Cbst and 10 third transistors M3. In this way, the demultiplexing circuit portion 140 may further include second discharge transistors M21 corresponding to each of a plurality of groups of a plurality of capacitors Cbst and a plurality of third transistors M3, whereby discharging characteristic of the control line CL may be more improved than the case that the second discharge transistor M21 is not provided, so as to overcome a limitation caused by degradation of the second transistor M2 and therefore an off current capable of being transferred to an organic light emitting diode may be prevented from occurring.

According to another example, the demultiplexing circuit portion 140 may include second discharge transistors M21 corresponding to each of a plurality of capacitors Cbst and a plurality of third transistors M3. For example, if the display apparatus includes n data lines DL1 to DLn and the demultiplexing circuit portion 140 is connected with three control lines CL_A, CL_B and CL_C, since one control line CL is connected with n/3 data lines DL, the voltage discharge portion 145 of the demultiplexing circuit portion 140 may include n/3 second discharge transistors M21.

The description of the demultiplexing circuit portion 140 according to one example and another example is only exemplary, and is not limited to the number of the transistors. Therefore, the demultiplexing circuit portion 140 may more improve discharging characteristic of the control line CL and control the number of the second discharge transistors M21 within the range that does not need excessive cost.

Figure 14:
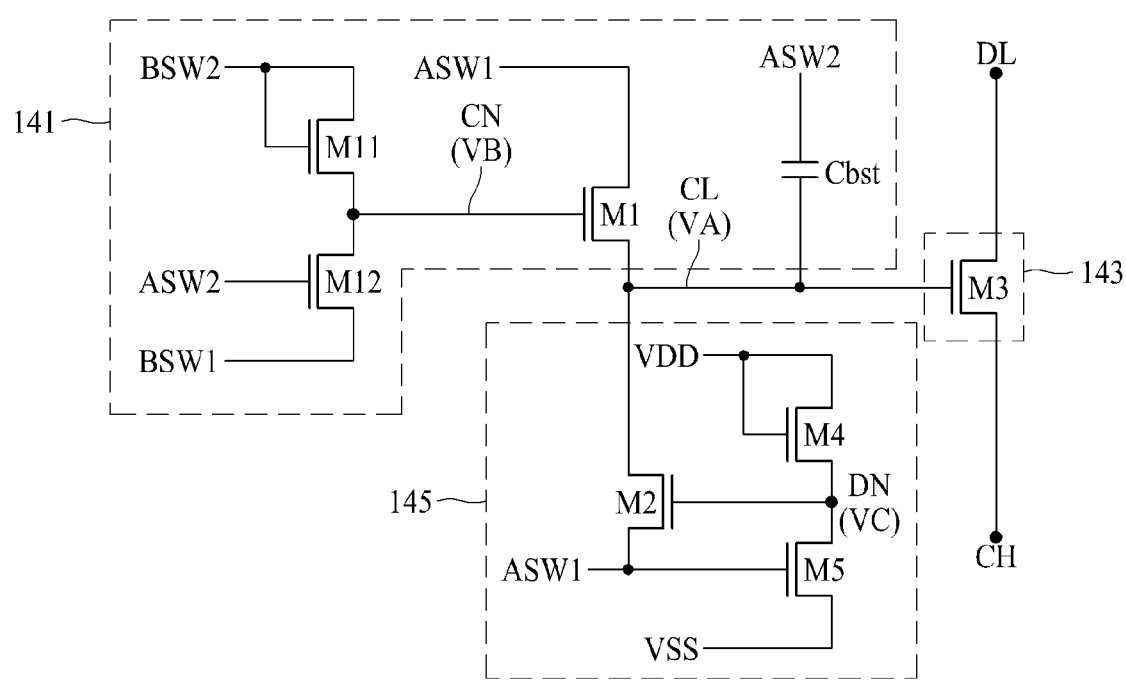
FIG. 14 is a circuit view illustrating further still another example of a demultiplexing circuit portion shown in FIG. 1.

FIG. 14 is a circuit view illustrating further still another example of a demultiplexing circuit portion shown in FIG. 1. The demultiplexing circuit portion 140 of FIG. 14 is different from the second transistor M2 in the demultiplexing circuit portion of FIG. 2, and further includes fourth and fifth transistors M4 and M5 in the demultiplexing circuit portion of FIG. 2 and its description the same as the aforementioned description will be simplified or omitted.

Referring to FIG. 14, the demultiplexing circuit portion 140 may include a voltage controller 141, a switching portion 143 and a voltage discharge portion 145.

The voltage controller 141 may include a first transistor M1, a charge transistor M11, a first discharge transistor M12, and a capacitor Cbst.

The first transistor M1 may be turned on based on a voltage VB of a charge node CN controlled by a first auxiliary signal ASW2 and a second auxiliary signal BSW2 to supply a time-division control signal ASW1 to a control line CL.

The charge transistor M1l may be turned on based on the second auxiliary signal BSW2 partially overlapped with a second time-division control signal BSW1 to supply the second auxiliary signal BSW2 to the charge node CN.

The first discharge transistor M12 may be turned on based on the first auxiliary signal ASW2 partially overlapped with the first time-division control signal ASW1 to discharge the voltage VB of the charge node CN.

The capacitor Cbst may more increase the voltage VA of the control line CL based on the first auxiliary signal ASW2 partially overlapped with the first time-division control signal ASW1.

The switching portion 143 may supply the data signals supplied from the data driving circuit portion 120 to at least two kinds of data lines DL based on the voltage VA of the control line CL in due order. The switching portion 143 may include a third transistor M3.

The voltage discharge portion 145 may discharge the voltage VA of the control line CL in response to the time-division control signals ASW1 and BSW1. In detail, the voltage discharge portion 145 may be turned on based on a voltage VC of a discharge node DN controlled by the time-division control signals ASW1 and BSW1 to discharge the control line CL. For example, the voltage discharge portion 145 may discharge the voltage VA of the control line CL based on the voltage VC of the discharge node DN having a voltage inverted with the time-division control signals ASW1 and BSW1. In this case, since the voltage VC of the discharge node DN has a voltage inverted with one time-division control signal ASW1 corresponding to one control line CL, the voltage discharge portion 145 may improve discharging characteristic of the demultiplexing circuit portion 140 by using only one time-division control signal ASW1 corresponding to one control line CL, and an off current transferred to an organic light emitting diode may be prevented from occurring.

The voltage discharge portion 145 may include a second transistor M2, a fourth transistor M4, and a fifth transistor M5.

The second transistor M2 may be turned on based on the voltage VC of the discharge node DN controlled by the first time-division control signal ASW1 to discharge the voltage VA of the control line CL. In detail, a gate electrode of the second transistor M2 may be connected with the discharge node DN, a drain electrode of the second transistor M2 may be connected with the control line CL and a source electrode of the second transistor M2 may receive the first time-division control signal ASW1. Also, the gate electrode of the second transistor M2 may be connected with each of a source electrode of the fourth transistor M4 and a drain electrode of the fifth transistor M5. At this time, the discharge node DN may have a voltage inverted with the time-division control signal ASW1. Therefore, if the first time-division control signal ASW1 of the low potential voltage is applied to the source electrode of the second transistor M2, the second transistor M2 may be turned on by the discharge node DN having the high potential voltage, and the voltage of the control line CL may be discharged.

The fourth transistor M4 may be turned on based on power voltage VDD to supply the power voltage VDD to the discharge node DN. In detail, a drain electrode and a gate electrode of the fourth transistor M4 may receive the power voltage VDD, and the source electrode of the fourth transistor M4 may be connected with the discharge node DN.

The fifth transistor M5 may be turned on based on the first time-division control signal ASW1 to discharge the discharge node DN. In detail, a gate electrode of the fifth transistor M5 may receive the first time-division control signal ASW1, the drain electrode of the fifth transistor M5 may be connected with the discharge node DN, and a source electrode of the fifth transistor M5 may be connected with a ground voltage VSS. Therefore, the discharge node DN may have a low potential voltage by means of the ground voltage VSS if the fifth transistor M5 is turned on, and may have a high potential voltage by means of the power voltage VDD if the fifth transistor M5 is turned off. That is, the voltage VC of the discharge node DN may be determined by depending on the first time-division control signal ASW1 for determining turn-on and turn-off of the fifth transistor M5.

For example, the second transistor M2, the fourth transistor M4, and the fifth transistor M5 may be provided in one set to control the voltage VC of the discharge node DN connected with the gate electrode of the second transistor M2.

As described above, since the voltage VC of the discharge node DN has a voltage inverted with the first time-division control signal ASW1 corresponding to the control line CL, the voltage discharge portion 145 may improve discharging characteristic of the demultiplexing circuit portion 140 by using only the first time-division control signal ASW corresponding to one control line CL, and may prevent an off current transferred to an organic light emitting diode from occurring.

Figure 15:
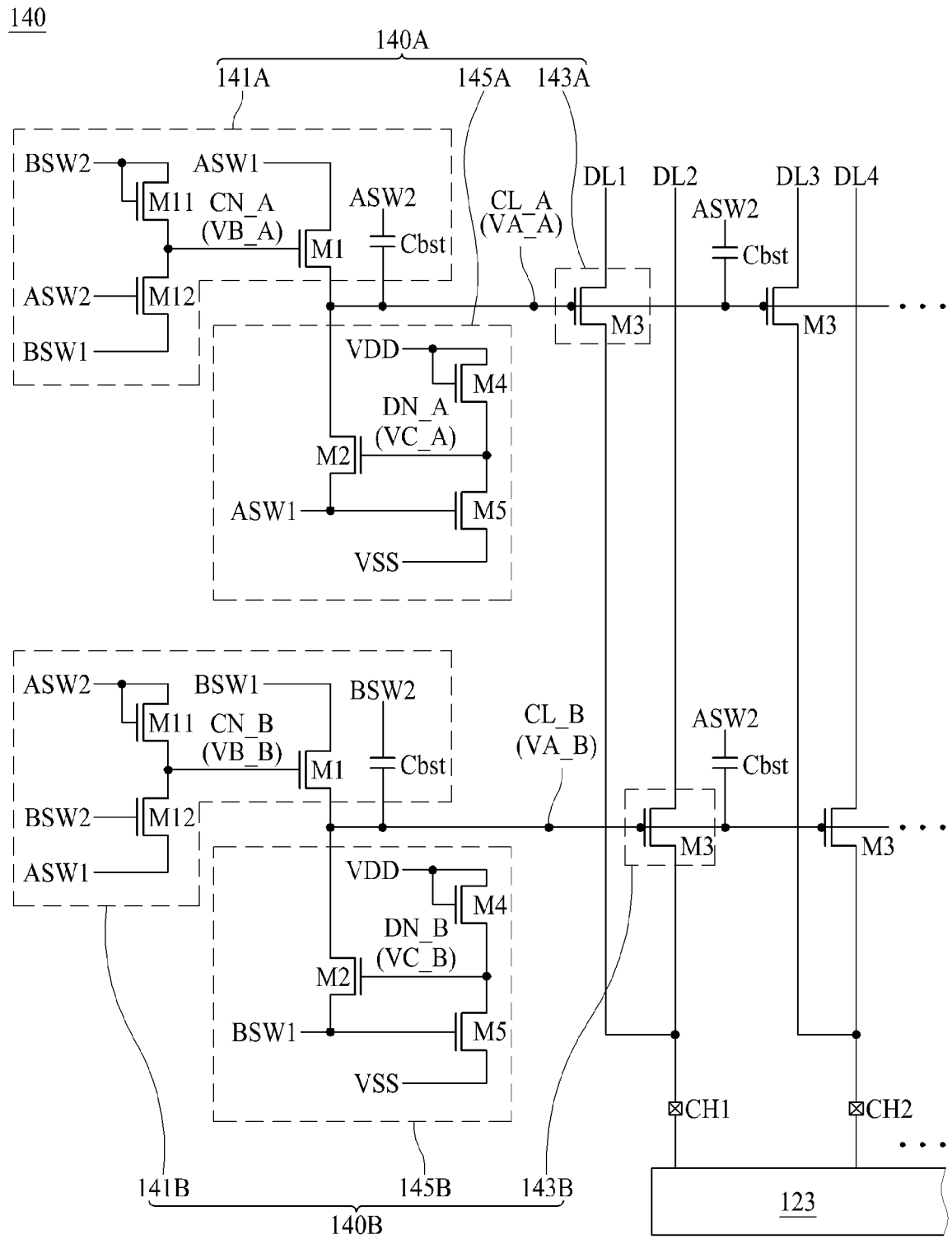
FIG. 15 is a circuit view illustrating that a demultiplexing circuit shown in FIG. 14 drives two kinds of data lines from one output channel according to one embodiment of the present disclosure.
Figure 16:
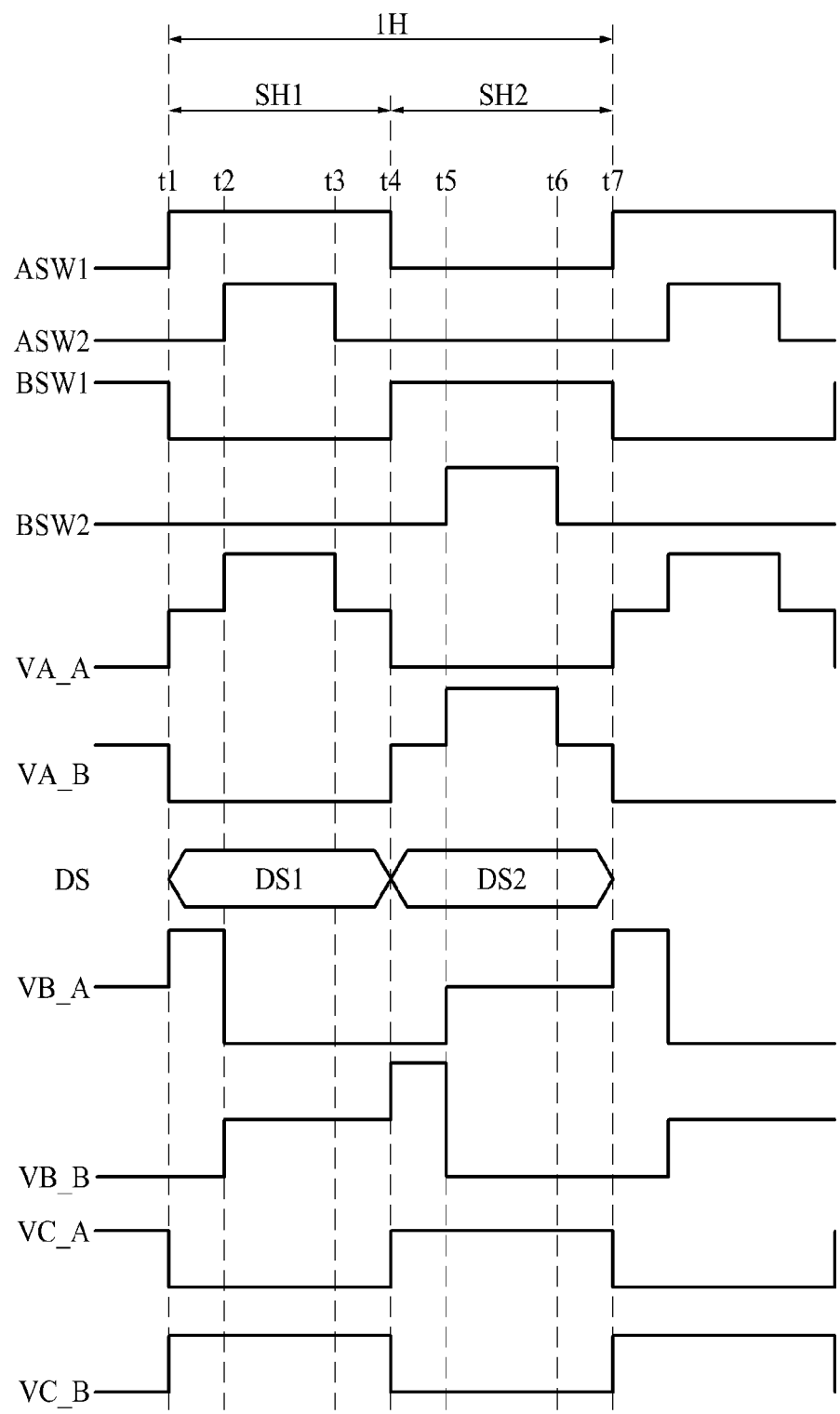
FIG. 16 is a waveform of signals supplied to a demultiplexing circuit portion shown in FIG. 15 according to one embodiment of the present disclosure.

FIG. 15 is a circuit view illustrating that a demultiplexing circuit shown in FIG. 14 drives two kinds of data lines from one output channel, and FIG. 16 is a waveform of signals supplied to a demultiplexing circuit portion shown in FIG. 15.

Referring to FIGS. 15 and 16, if the demultiplexing circuit portion 140 is connected with two control lines CL_A and CL_B and connected with n data lines DL, the plurality of driving integrated circuits 123 of the data driving circuit portion 120 may have n/2 output channels CH. Therefore, as the display apparatus comprises the demultiplexing circuit portion 140 connected with two control lines CL_A and CL_B, image of high resolution may be embodied while the number of output channels CH of the plurality of driving integrated circuits 123 may be reduced to ½ as compared with the display apparatus that does not comprise the demultiplexing circuit portion 140.

The demultiplexing circuit portion 140 may include a first voltage controller 141A, a first switching portion 143A, and a first voltage discharge portion 145A, which are connected with the first control line CL_A, and a second voltage controller 141B, a second switching portion 143B, and a second voltage discharge portion 145B, which are connected with the second control line CL_B.

The first transistor M1 of the first voltage controller 141A may be turned on based on a voltage VB_A of a first charge node CN_A controlled by the first auxiliary signal ASW2 and the second auxiliary signal BSW2 to supply the first time-division control signal ASW1 to the first control line CL_A. The charge transistor M11 of the first voltage controller 141A may be turned on based on the second auxiliary signal BSW2 to supply the second auxiliary signal BSW2 to the first charge node CN_A, and the first discharge transistor M12 of the first voltage controller 141A may be turned on based on the first auxiliary signal ASW2 to discharge the voltage VB_A of the first charge node CN_A. Also, the capacitor Cbst of the first voltage controller 141A may bootstrap a voltage VA_A of the first control line CL_A based on the first auxiliary signal ASW2.

The first transistor M1 of the second voltage controller 141B may be turned on based on a voltage VB_B of a second charge node CN_B controlled by the first auxiliary signal ASW2 and the second auxiliary signal BSW2 to supply the second time-division control signal BSW1 to the second control line CL_B. The charge transistor M11 of the second voltage controller 141B may be turned on based on the first auxiliary signal ASW2 to supply the first auxiliary signal ASW2 to the second charge node CN_B, and the first discharge transistor M12 of the second voltage controller 141B may be turned on based on the second auxiliary signal BSW2 to discharge the voltage VB_B of the second charge node CN_B. Also, the capacitor Cbst of the second voltage controller 141B may bootstrap a voltage VA_B of the second control line CL_B based on the second auxiliary signal BSW2.

In this way, the first voltage controller 141A may maintain the voltage VA_A of the first control line CL_A at a high potential voltage for a first sub horizontal period SH1 of one horizontal period 1H, and the second voltage controller 141B may maintain the voltage VA_B of the second control line CL_B at a high potential voltage for a second sub horizontal period SH2 of one horizontal period 1H.

According to one example, a first transition time t2 and a second transition time t3 of the first auxiliary signal ASW2 may correspond to a time between a first transition time t1 and a second transition time t4 of the first time-division control signal ASW1, and a first transition time t5 and a second transition time t6 of the second auxiliary signal BSW2 may correspond to a time between a first transition time t4 and a second transition time t7 of the second time-division control signal BSW1. In this case, a first transition time of each of a plurality of signals may correspond to, but is not limited to, a rising edge, and a second transition time thereof may correspond to, but is not limited to, a falling edge. Therefore, the voltage VA_A of the first control line CL_A may primarily be increased at the time t1 when the first time-division control signal ASW1 is applied, and may secondarily be increased by bootstrapping at a time t2 when the first auxiliary signal ASW2 is applied. Also, the voltage VA_B of the second control line CL_B may primarily be increased at the time t4 when the second time-division control signal BSW1 is applied, and may secondarily be increased by bootstrapping at a time t5 when the second auxiliary signal BSW2 is applied. Meanwhile, the voltages VA_A and VA_B of each of the first and second control lines CL_A and CL_B may return to the voltages prior to bootstrapping at the second transition time t3 and t6 of each of the first and second auxiliary signals ASW2 and BSW2.

According to one example, the voltage VB_A of the first charge node CN_A may be charged from the applying time t5 of the second auxiliary signal BSW2 and bootstrapped at the applying time t7 or t1 of the first time-division control signal ASW1. Also, the voltage VB_A of the first charge node CN_A may be discharged from the applying time t2 of the first auxiliary signal ASW2. For example, after the first charge node CN_A is charged by the second auxiliary signal BSW2, if the first time-division control signal ASW1 is applied to the first control line CL_A, the voltage VB_A of the first charge node CN_A may be bootstrapped by gate-source capacitance of the first transistor M1. At this time, if the voltage VB_A of the first charge node CN_A is bootstrapped, the first control line CL_A may be pre-charged to enhance charging of the first control line CL_A, whereby the output of the demultiplexing circuit portion 140 may stably be maintained.

The third transistor M3 of the first switching portion 143A may be turned on based on the voltage VA_A of the first control line CL_A to supply a data signal DS1 supplied from the plurality of output channels CH of the driving integrated circuit 123 to first data lines DL1, DL3, . . . , DLn-1 of two kinds of data lines corresponding to each of the plurality of output channels CH.

According to one example, the third transistor M3 of the first switching portion 143A may be turned on from the first transition time t1 of the first time-division control signal ASW1 to the second transition time t4 of the first time-division control signal ASW1 to supply the data signal DS1 to the first data lines DL1, DL3, . . . , DLn-1 of two kinds of data lines DL. In detail, since the control line CL is charged by the first transistor M1 from the time t1 when the first time-division control signal ASW1 has a high potential voltage and discharged by the second transistor M2 from the time t4 when the first time-division control signal ASW1 has a low potential voltage, the third transistor M3 may be turned on from the first transition time t1 of the first time-division control signal ASW1 to the second transition time t4 of the first time-division control signal ASW1.

The third transistor M3 of the second switching portion 143B may be turned on based on the voltage VA_B of the second control line CL_B to supply a data signal DS2 supplied from the plurality of output channels CH of the driving integrated circuit 123 to second data lines DL2, DL4, . . . , DLn of two kinds of data lines corresponding to each of the plurality of output channels CH.

In this way, the first switching portion 143A may be turned on for the first sub horizontal period SH1 of one horizontal period 1H to supply the data signal DS1 to the first data lines DL1, DL3, . . . , DLn-1 of two kinds of data lines DL corresponding to each of the plurality of output channels CH, and the second switching portion 143B may be turned on for the second sub horizontal period SH2 of one horizontal period 1H to supply the data signal DS2 to the second data lines DL2, DL4, . . . , DLn of two kinds of data lines DL corresponding to each of the plurality of output channels CH. Therefore, as the display apparatus comprises the demultiplexing circuit portion 140 connected with two control lines CL_A and CL_B, image of high resolution may be embodied while the number of output channels CH of the plurality of driving integrated circuits 123 may be reduced to ½ as compared with the display apparatus that does not comprise the demultiplexing circuit portion 140.

The second transistor M2 of the first voltage discharge portion 145A may be turned on based on the voltage VC_A of the discharge node DN_A, which is inverted with the first time-division control signal ASW1, to discharge the voltage VA_A of the first control line CL_A, the fourth transistor M4 of the first voltage discharge portion 145A may be turned on based on the power voltage VDD to supply the power voltage VDD to the discharge node DN_A, and the fifth transistor M5 of the first voltage discharge portion 145A may be turned based on the first time-division control signal ASW1 to discharge the discharge node DN_A.

The second transistor M2 of the second voltage discharge portion 145B may be turned on based on a voltage VC_B of a discharge node DN_B, which is inverted with the second time-division control signal BSW1, to discharge the voltage VA_B of the second control line CL_B, the fourth transistor M4 of the second voltage discharge portion 145B may be turned on based on the power voltage VDD to supply the power voltage VDD to the discharge node DN_B, and the fifth transistor M5 of the second voltage discharge portion 145B may be turned on based on the second time-division control signal BSW1 to discharge the discharge node DN_B.

As described above, the second transistor M2 of the first voltage discharge portion 145A may be turned on at a time period t4 when the first sub horizontal period SH1 of one horizontal period 1H ends or the second sub horizontal period SH2 starts, to discharge the voltage VA_A of the first control line CL_A. At this time, the voltage VC of the discharge node DN for turning on the second transistor M2 of the voltage discharge portion 145 may be stably maintained by the fourth and fifth transistors M4 and M5. Therefore, as the voltage discharge portion 145 of the demultiplexing circuit portion 140 includes the fourth and fifth transistors M4 and M5, the voltage discharge portion 145 may improve discharging characteristic of the voltage VA of the control line CL even in the case that the second transistor M2 is degraded, and may prevent an off current transferred to an organic light emitting diode from occurring. As a result, the demultiplexing circuit portion 140 may stably maintain the output of the third transistor M3 turned on based on the voltage VA of the control line CL, whereby luminance of the display panel may be prevented from being deteriorated and image of high resolution of the display panel may be embodied.

According to one example, each of a set of the first transistor M1, the charge transistor M11 and the first discharge transistor M12 of the voltage controller 141 and a set of the second transistor M2, the fourth transistor M4 and the fifth transistor M5 of the voltage discharge portion 145 may be arranged at each of both ends of one control line CL, and one control line CL may be connected with a plurality of capacitors Cbst and a plurality of switching portions 143. In this way, a set of the first transistor M1, the charge transistor M11 and the first discharge transistor M12, which are arranged at each of both ends of the control line CL may turn on or turn off the plurality of switching portions 143 connected with the control line CL by charging or discharging the voltage VA of the control line CL. At this time, as the voltage discharge portion 145 includes the fourth and fifth transistors M4 and M5 for stably maintaining the voltage VC of the discharge node DN, discharging characteristic of the voltage VA of the control line CL may be improved.

Figure 17:
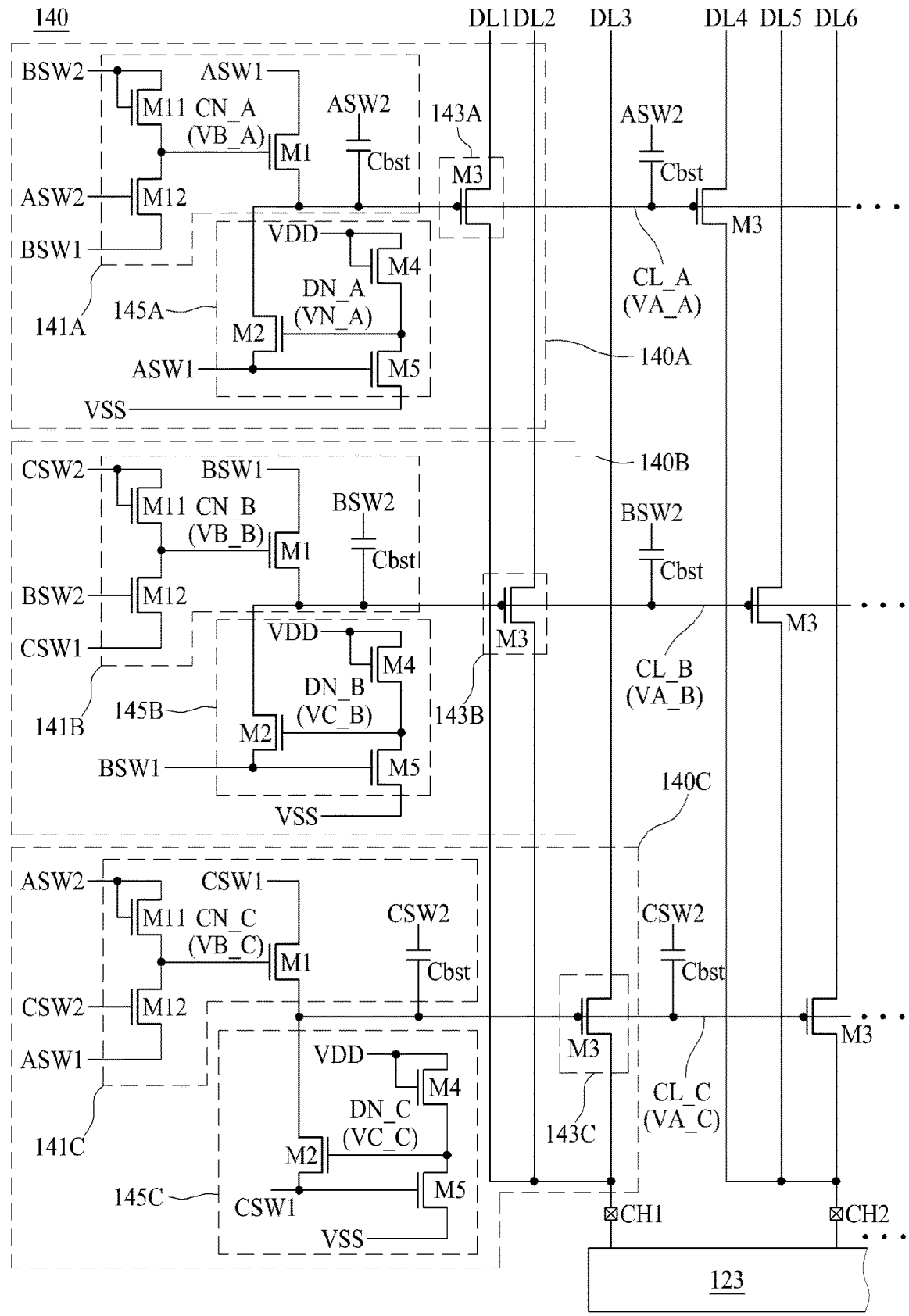
FIG. 17 is a circuit view illustrating that a demultiplexing circuit shown in FIG. 14 drives three kinds of data lines from one output channel according to one embodiment of the present disclosure.
Figure 18:
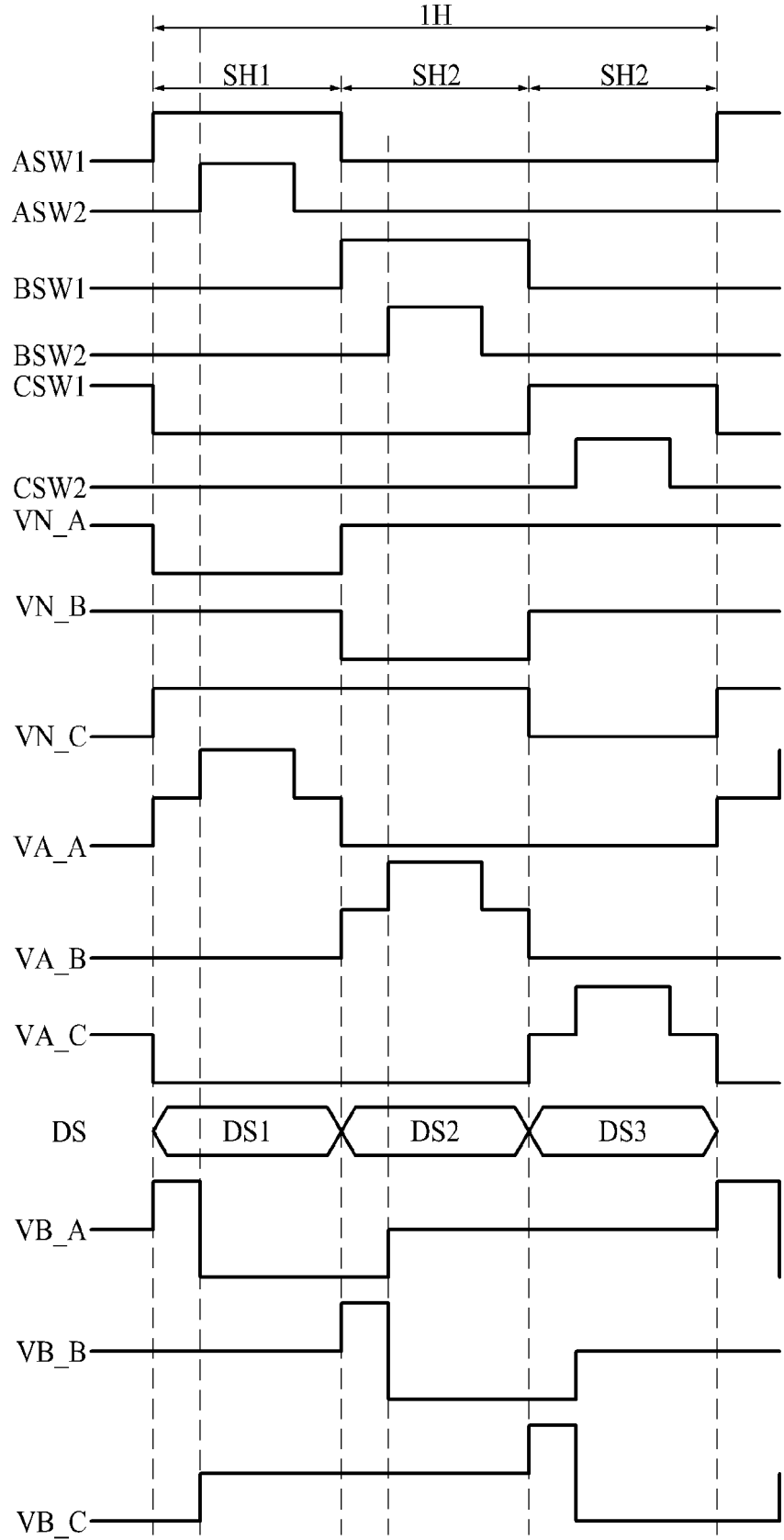
FIG. 18 is a waveform of signals supplied to a demultiplexing circuit portion shown in FIG. 17 according to one embodiment of the present disclosure.

FIG. 17 is a circuit view illustrating that a demultiplexing circuit portion shown in FIG. 14 drives three kinds of data lines from one output channel, and FIG. 18 is a waveform of signals supplied to a demultiplexing circuit portion shown in FIG. 17.

Referring to FIGS. 17 and 18, if the demultiplexing circuit portion 140 is connected with three control lines CL_A, CL_B and CL_C and connected with n data lines DL, the plurality of driving integrated circuits 123 of the data driving circuit portion 120 may have n/3 output channels CH. Therefore, as the display apparatus comprises the demultiplexing circuit portion 140 connected with three control lines CL_A, CL_B and CL_C, image of high resolution may be embodied while the number of output channels CH of the plurality of driving integrated circuits 123 may be reduced to ⅓ as compared with the display apparatus that does not comprise the demultiplexing circuit portion 140.

The demultiplexing circuit portion 140 may include a first circuit portion 140A that includes a first voltage controller 141A, a first switching portion 143A and a first voltage discharge portion 145A, which are connected with the first control line CL_A, a second circuit portion 140B that includes a second voltage controller 141B, a second switching portion 143B and a second voltage discharge portion 145B, which are connected with the second control line CL_B, and a third circuit portion 140C that includes a third voltage controller 141C, a third switching portion 143C and a third voltage discharge portion 145C, which are connected with the third control line CL_C.

The first transistor M1 of the first voltage controller 141A may be turned on based on the voltage VB_A of the first charge node CN_A controlled by the first auxiliary signal ASW2 and the second auxiliary signal BSW2 to supply the first time-division control signal ASW1 to the first control line CL_A. The charge transistor M11 of the first voltage controller 141A may be turned on based on the second auxiliary signal BSW2 to supply the second auxiliary signal BSW2 to the first charge node CN_A, and the first discharge transistor M12 of the first voltage controller 141A may be turned on based on the first auxiliary signal ASW2 to discharge the voltage VB_A of the first discharge node CN_A. Also, the capacitor Cbst of the first voltage controller 141A may bootstrap a voltage VA_A of the first control line CL_A based on the first auxiliary signal ASW2.

The first transistor M1 of the second voltage controller 141B may be turned on based on the voltage VB_B of the second charge node CN_B controlled by the second auxiliary signal BSW2 and the third auxiliary signal CSW2 to supply the second time-division control signal BSW1 to the second control line CL_B. The charge transistor M11 of the second voltage controller 141B may be turned on based on the third auxiliary signal CSW2 to supply the third auxiliary signal CSW2 to the second charge node CN_B, and the first discharge transistor M12 of the second voltage controller 141B may be turned on based on the second auxiliary signal BSW2 to discharge the voltage VB_B of the second discharge node CN_B. Also, the capacitor Cbst of the second voltage controller 141B may bootstrap a voltage VA_B of the second control line CL_B based on the second auxiliary signal BSW2.

The first transistor M1 of the third voltage controller 141C may be turned on based on the voltage VB_C of the third charge node CN_C controlled by the first auxiliary signal ASW2 and the third auxiliary signal CSW2 to supply the third time-division control signal CSW1 to the third control line CL_C. The charge transistor M11 of the third voltage controller 141C may be turned on based on the first auxiliary signal ASW2 to supply the first auxiliary signal ASW2 to the third charge node CN_C, and the first discharge transistor M12 of the third voltage controller 141C may be turned on based on the third auxiliary signal CSW2 to discharge the voltage VB_C of the third discharge node CN_C. Also, the capacitor Cbst of the third voltage controller 141C may bootstrap a voltage VA_C of the third control line CL_C based on the third auxiliary signal CSW2.

In this way, the first voltage controller 141A may maintain the voltage VA_A of the first control line CL_A at a high potential voltage for the first sub horizontal period SH1 of one horizontal period 1H, the second voltage controller 141B may maintain the voltage VA_B of the second control line CL_B at a high potential voltage for the second sub horizontal period SH2 of one horizontal period 1H, and the third voltage controller 141C may maintain the voltage VA_C of the third control line CL_C at a high potential voltage for a third sub horizontal period SH3 of one horizontal period 1H.

Therefore, the demultiplexing circuit portion 140 may control the voltage VB of the charge node CN through the charge transistor M11 and the first discharge transistor M12 to improve charging characteristic of the control line CL even in the case that the first to third transistors M1, M2 and M3 are degraded, and may prevent an off current transferred to an organic light emitting diode from occurring. As a result, the demultiplexing circuit portion 140 may stably maintain the output of the third transistor M3 turned on based on the voltage VA of the control line CL, whereby luminance of the display panel may be prevented from being deteriorated and image of high resolution of the display panel may be embodied.

The third transistor M3 of the first switching portion 143A may be turned on based on the voltage VA_A of the first control line CL_A to supply a data signal DS1 supplied from the plurality of output channels CH of the driving integrated circuit 123 to first data lines DL1, DL4, . . . , DLn−2 of three kinds of data lines corresponding to each of the plurality of output channels CH.

The third transistor M3 of the second switching portion 143B may be turned on based on the voltage VA_B of the second control line CL_B to supply a data signal DS2 supplied from the plurality of output channels CH of the driving integrated circuit 123 to second data lines DL2, DL5, . . . , DLn−1 of three kinds of data lines corresponding to each of the plurality of output channels CH.

The third transistor M3 of the third switching portion 143C may be turned on based on the voltage VA_C of the third control line CL_C to supply a data signal DS3 supplied from the plurality of output channels CH of the driving integrated circuit 123 to third data lines DL3, DL6, . . . , DLn of three kinds of data lines corresponding to each of the plurality of output channels CH.

In this way, the first switching portion 143A may be turned on for the first sub horizontal period SH1 of one horizontal period 1H to supply the data signal DS1 to the first data lines DL1, DL4, ..., DLn−2 of three kinds of data lines DL corresponding to each of the plurality of output channels CH, the second switching portion 143B may be turned on for the second sub horizontal period SH2 of one horizontal period 1H to supply the data signal DS2 to the second data lines DL2, DL5, ..., DLn−1 of three kinds of data lines DL corresponding to each of the plurality of output channels CH, and the third switching portion 143C may be turned on for the third sub horizontal period SH3 of one horizontal period 1H to supply the data signal DS3 to the third data lines DL3, DL6, ..., DLn of three kinds of data lines DL corresponding to each of the plurality of output channels CH. Therefore, as the display apparatus comprises the demultiplexing circuit portion 140 connected with three control lines CL_A, CL_B and CL_C, image of high resolution may be embodied while the number of output channels CH of the plurality of driving integrated circuits 123 may be reduced to ⅓ as compared with the display apparatus that does not comprise the demultiplexing circuit portion 140.

The second transistor M2 of the first voltage discharge portion 145A may be turned on based on a voltage VC_A of a discharge node DN_A, which is inverted with the first time-division control signal ASW1, to discharge the voltage VA_A of the first control line CL_A, the fourth transistor M4 of the first voltage discharge portion 145A may be turned on based on the power voltage VDD to supply the power voltage VDD to the discharge node DN_A, and the fifth transistor M5 of the first voltage discharge portion 145A may be turned on based on the first time-division control signal ASW1 to discharge the discharge node DN_A.

The second transistor M2 of the second voltage discharge portion 145B may be turned on based on a voltage VC_B of a discharge node DN_B, which is inverted with the second time-division control signal BSW1, to discharge the voltage VA_B of the second control line CL_B, the fourth transistor M4 of the second voltage discharge portion 145B may be turned on based on the power voltage VDD to supply the power voltage VDD to the discharge node DN_B, and the fifth transistor M5 of the second voltage discharge portion 145B may be turned on based on the second time-division control signal BSW1 to discharge the discharge node DN_B.

The second transistor M2 of the third voltage discharge portion 145C may be turned on based on a voltage VC_C of a discharge node DN_C, which is inverted with the third time-division control signal CSW1, to discharge the voltage VA_C of the third control line CL_C, the fourth transistor M4 of the third voltage discharge portion 145C may be turned on based on the power voltage VDD to supply the power voltage VDD to the discharge node DN_C, and the fifth transistor M5 of the third voltage discharge portion 145C may be turned on based on the third time-division control signal CSW1 to discharge the discharge node DN_C.

Therefore, as the voltage discharge portion 145 of the demultiplexing circuit portion 140 includes the fourth and fifth transistors M4 and M5, the voltage discharge portion 145 may improve discharging characteristic of the voltage VA of the control line CL even in the case that the second transistor M2 is degraded, and may prevent an off current transferred to an organic light emitting diode from occurring. As a result, the demultiplexing circuit portion 140 may stably maintain the output of the third transistor M3 turned on based on the voltage VA of the control line CL, whereby luminance of the display panel may be prevented from being deteriorated and image of high resolution of the display panel may be embodied.

Figure 19:
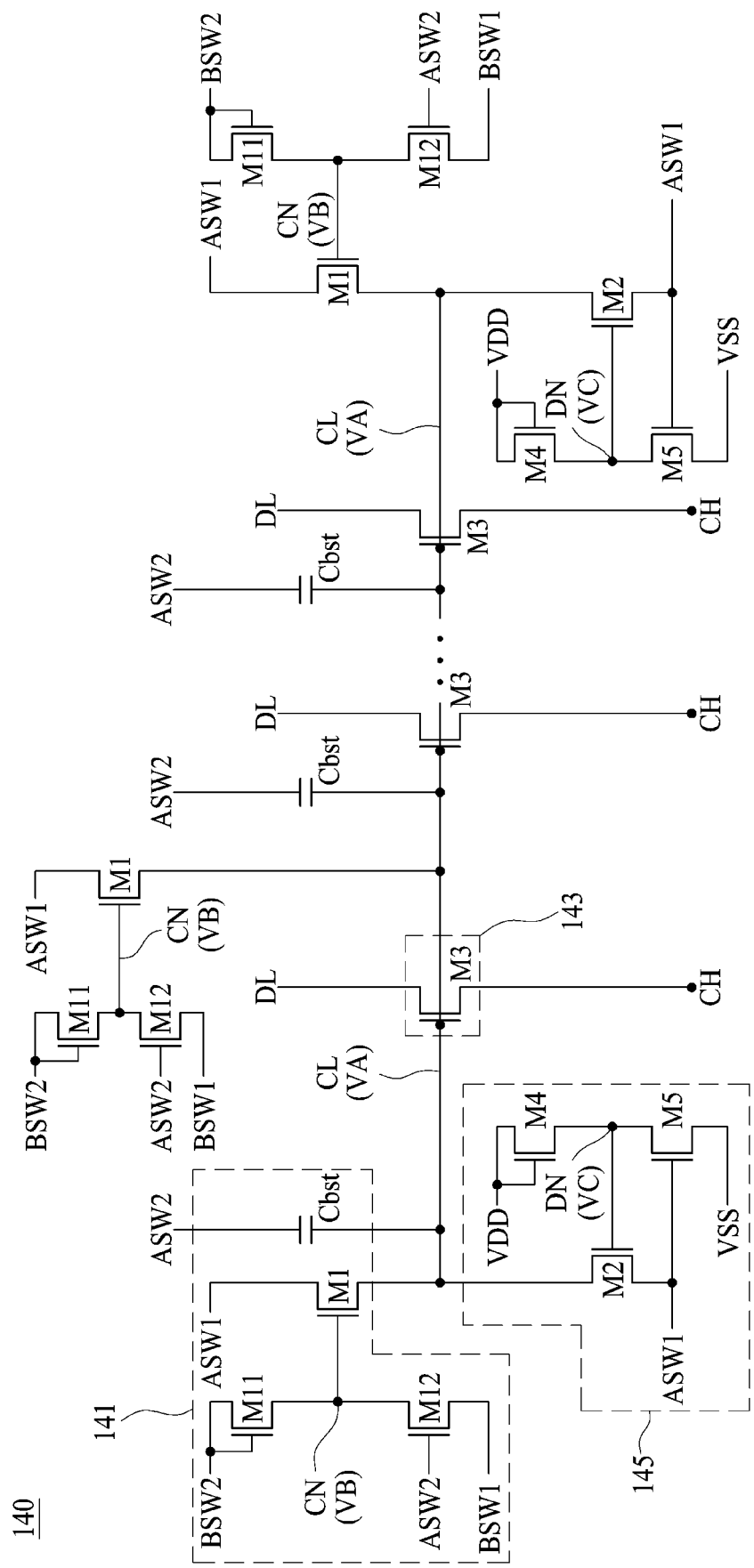
FIG. 19 is a circuit view illustrating further still another example of a demultiplexing circuit portion shown in FIG. 14.

FIG. 19 is a circuit view illustrating another example of a demultiplexing circuit portion shown in FIG. 14.

Referring to FIG. 19, the demultiplexing circuit portion 140 may include a set of a first transistor M1, a charge transistor M11 and a first discharge transistor M12 and a set of second, fourth and fifth transistors M2, M4 and M5, which are arranged at each of both ends of one control line CL, wherein one control line CL may be connected with a plurality of capacitors Cbst and a plurality of third transistors M3. At this time, a set of the first transistor M1, the charge transistor M11 and the first discharge transistor M12, which are arranged at each of both ends of one control line CL, may charge the voltage VA of the control line CL, and a set of the second, fourth and fifth transistors M2, M4 and M5 arranged at each of both ends of one control line CL may discharge the voltage VA of the control line CL. Each of the plurality of capacitors Cbst may be arranged to correspond to each of the plurality of third transistors M3, whereby the voltage VA of the control line CL may be subjected to bootstrapping.

The voltage controller 141 of the demultiplexing circuit portion 140 may further include p number of first transistors M1 (p is a natural number of 1 to (n/i−2)) turned on based on the voltage VB of the charge node CN controlled by the kth auxiliary signal and the k+1th auxiliary signal to supply the kth time-division control signal to supply the kth control line.

The voltage controller 141 may further include p charge transistors M11 turned on based on the k+1th auxiliary signal to supply the k+1th auxiliary signal to the charge node CN connected with the gate electrode of each of the p number of first transistors M1, and may further p number of first discharge charge transistors M12 turned on based on the kth auxiliary signal to discharge the voltage VB of the charge node CN connected with the gate electrode of each of the p number of first transistors M1. For example, the first transistor M1, the charge transistor M11 and the first discharge transistor M12 may be provided in one set to control the voltage VB of the charge node CN connected with the gate electrode of the first transistor M1.

In this way, the voltage controller 141 includes additional first transistor M1, charge transistor M11 and first discharge transistor M12 separately from the two first transistors M1, the two charge transistors M11 and the two first discharge transistors M12, which are arranged at each of both ends of one control line CL, whereby charging characteristics of the control line CL may be enhanced and therefore the voltage VA of the control line CL may stably be maintained.

According to one example, the voltage controller 141 of the demultiplexing circuit portion 140 may further include a set of a first transistor M1, a charge transistor M11 and a first discharge transistor M12 by grouping a plurality of capacitors Cbst and a plurality of third transistors M3 in a predetermined unit to correspond to each of the plurality of groups. For example, if the display apparatus includes n data lines DL1 to DLn and the demultiplexing circuit portion 140 is connected with three control lines CL_A, CL_B and CL_C, since one control line CL is connected with n/3 data lines DL, the demultiplexing circuit portion 140 may include n/3 third transistors M3 connected with one control line CL. At this time, the demultiplexing circuit portion 140 may further include n/30 first transistors M1, a charge transistor M11 and a first discharge transistor M12 by grouping a plurality of capacitors Cbst and a plurality of third transistors M3 in a unit of 10 capacitors Cbst and 10 third transistors M3. In this way, the voltage controller 141 of the demultiplexing circuit portion 140 may further include a first transistor M1, a charge transistor M11 and a first discharge transistor M12, which correspond to each of a plurality of groups of a plurality of capacitors Cbst and a plurality of third transistors M3, whereby charging characteristic may be improved in all areas of the control line CL and therefore the voltage VA of the control line CL may stably be maintained.

According to another example, the voltage controller 141 of the demultiplexing circuit portion 140 may include a first transistor M1, a charge transistor M11 and a first discharge transistor M12, which correspond to each of a plurality of capacitors Cbst and a plurality of third transistors M3. For example, if the display apparatus includes n data lines DL1 to DLn and the demultiplexing circuit portion 140 is connected with three control lines CL_A, CL_B and CL_C, since one control line CL is connected with n/3 data lines DL, the voltage controller 141 of the demultiplexing circuit portion 140 may include n/3 first transistors M1, charge transistors M11 and first discharge transistors M12 including a first transistor M1, a charge transistor M11 and a first discharge transistor M12, which are arranged at each of both ends of the control line CL.

The description of the demultiplexing circuit portion 140 according to one example and another example is only exemplary, and is not limited to the number of the transistors. Therefore, the voltage controller 141 of the demultiplexing circuit portion 140 may improve charging characteristic in all areas of the control line CL and control the number of the first transistors M1, the charge transistors M11 and the first discharge transistors M12 within the range that does not need excessive cost.

Figure 20:
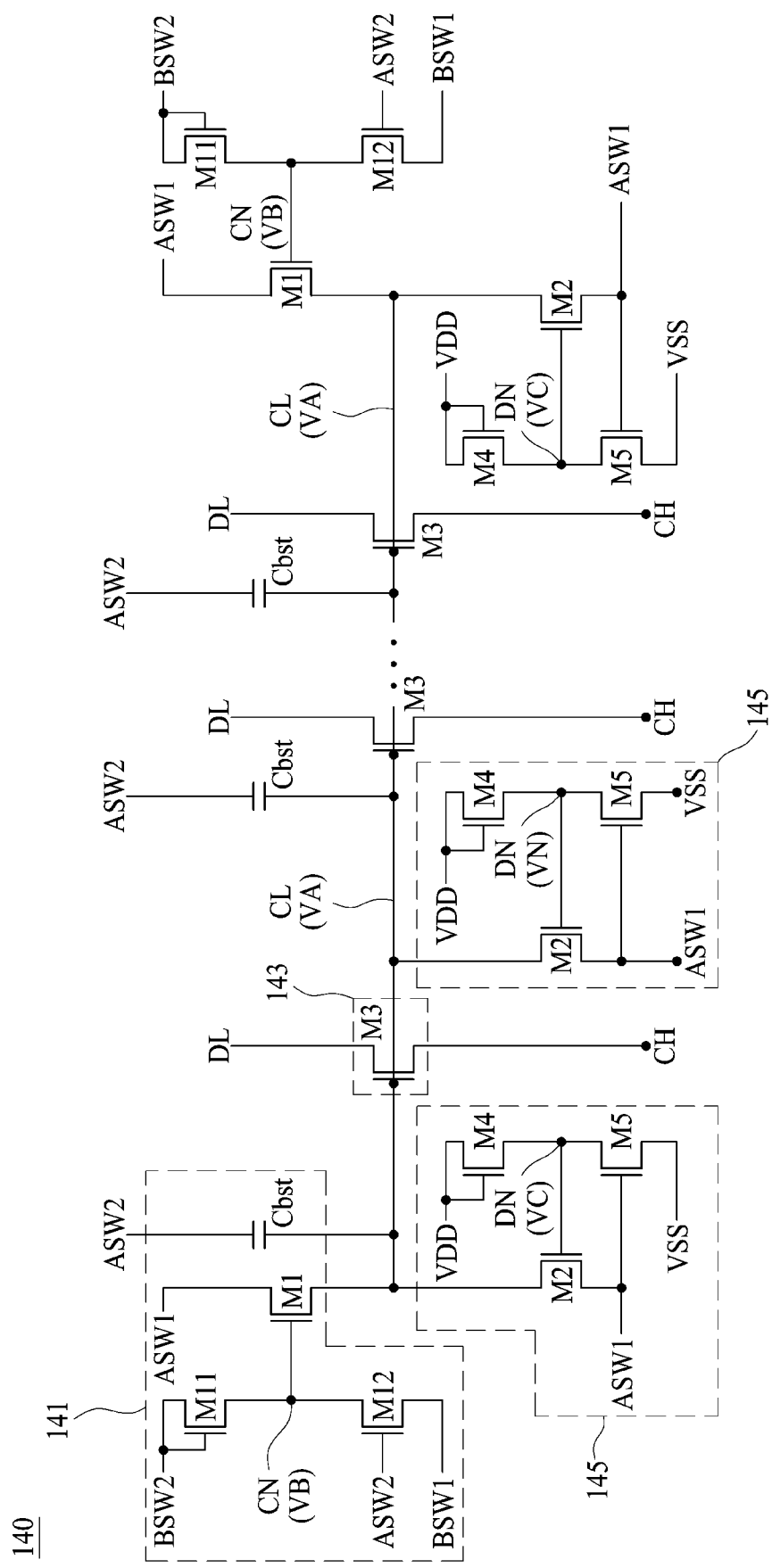
FIG. 20 is a circuit view illustrating further still another example of a demultiplexing circuit portion shown in FIG. 14.

FIG. 20 is a circuit view illustrating still another example of a demultiplexing circuit portion shown in FIG. 14.

Referring to FIG. 20, the demultiplexing circuit portion 140 may include a set of a first transistor M1, a charge transistor M11 and a first discharge transistor M12 and a set of second, fourth and fifth transistors M2, M4 and M5, which are arranged at each of both ends of one control line CL, wherein one control line CL may be connected with a plurality of capacitors Cbst and a plurality of third transistors M3. At this time, a set of the first transistor M1, the charge transistor M11 and the first discharge transistor M12, which are arranged at each of both ends of one control line CL, may charge the voltage VA of the control line CL, and a set of the second, fourth and fifth transistors M2, M4 and M5 arranged at each of both ends of one control line CL may discharge the voltage VA of the control line CL. Each of the plurality of capacitors Cbst may be arranged to correspond to each of the plurality of third transistors M3, whereby the voltage VA of the control line CL may be subjected to bootstrapping.

The voltage discharge portion 145 of the demultiplexing circuit portion 140 may further include p number of second transistors M2 (p is a natural number of 1 to (n/i−2)) turned on based on the voltage VC of the discharge node DN controlled by the kth time-division control signal to discharge the kth control line CL. In detail, the voltage discharge portion 145 may include additional second transistor M2 separately from the two second transistors M2 arranged at each of both ends of one control line CL, whereby discharging characteristic of the control line CL may be improved and therefore an off current transferred to an organic light emitting diode may be prevented from occurring.

According to one example, the voltage discharge portion 145 of the demultiplexing circuit portion 140 may further include a second transistor M2 by grouping a plurality of capacitors Cbst and a plurality of third transistors M3 in a predetermined unit to correspond to each of the plurality of groups. For example, if the display apparatus includes n data lines DL1 to DLn and the demultiplexing circuit portion 140 is connected with three control lines CL_A, CL_B and CL_C, since one control line CL is connected with n/3 data lines DL, the demultiplexing circuit portion 140 may include n/3 third transistors M3 connected with one control line CL. At this time, the demultiplexing circuit portion 140 may further include n/30 second transistors M2 by grouping a plurality of capacitors Cbst and a plurality of third transistors M3 in a unit of 10 capacitors Cbst and 10 third transistors M3. In this way, the voltage discharge portion 145 of the demultiplexing circuit portion 140 may further include a second transistor M2 corresponding to a plurality of groups of a plurality of capacitors Cbst and a plurality of third transistors M3, whereby discharging characteristic may be improved in all areas of the control line CL to overcome a limitation caused by degradation of the second transistor M2 and therefore an off current capable of being transferred to an organic light emitting diode may be prevented from occurring.

According to another example, the voltage discharge portion 145 of the demultiplexing circuit portion 140 may include a second transistor M2 corresponding to each of a plurality of capacitors Cbst and a plurality of third transistors M3. For example, if the display apparatus includes n data lines DL1 to DLn and the demultiplexing circuit portion 140 is connected with three control lines CL_A, CL_B and CL_C, since one control line CL is connected with n/3 data lines DL, the voltage discharge portion 145 of the demultiplexing circuit portion 140 may include n/3 second transistors M2 including a second transistor M2 arranged at each of both ends of the control line CL.

The voltage discharge portion 145 of the demultiplexing circuit portion 140 may further include a plurality of fourth transistors M4 turned on based on a power voltage VDD to supply the power voltage VDD to the discharge node DN and a plurality of fifth transistors M5 turned on based on the kth time-division control signal to discharge the discharge node DN, and the number of each of the plurality of fourth transistors M4 and the plurality of fifth transistors M5 may be equal to the number of the second transistors M2. Therefore, the second, fourth and fifth transistors M2, M4 and M5 may be provided in one set to control the voltage VB of the discharge node CN connected with the gate electrode of the second transistor M2.

The description of the demultiplexing circuit portion 140 according to one example and another example is only exemplary, and is not limited to the number of the transistors. Therefore, the voltage discharge portion 145 of the demultiplexing circuit portion 140 may improve discharging characteristic in all areas of the control line CL and control the number of the second, fourth and fifth transistors M2, M4 and M5 within the range that does not need excessive cost.

Figure 21:
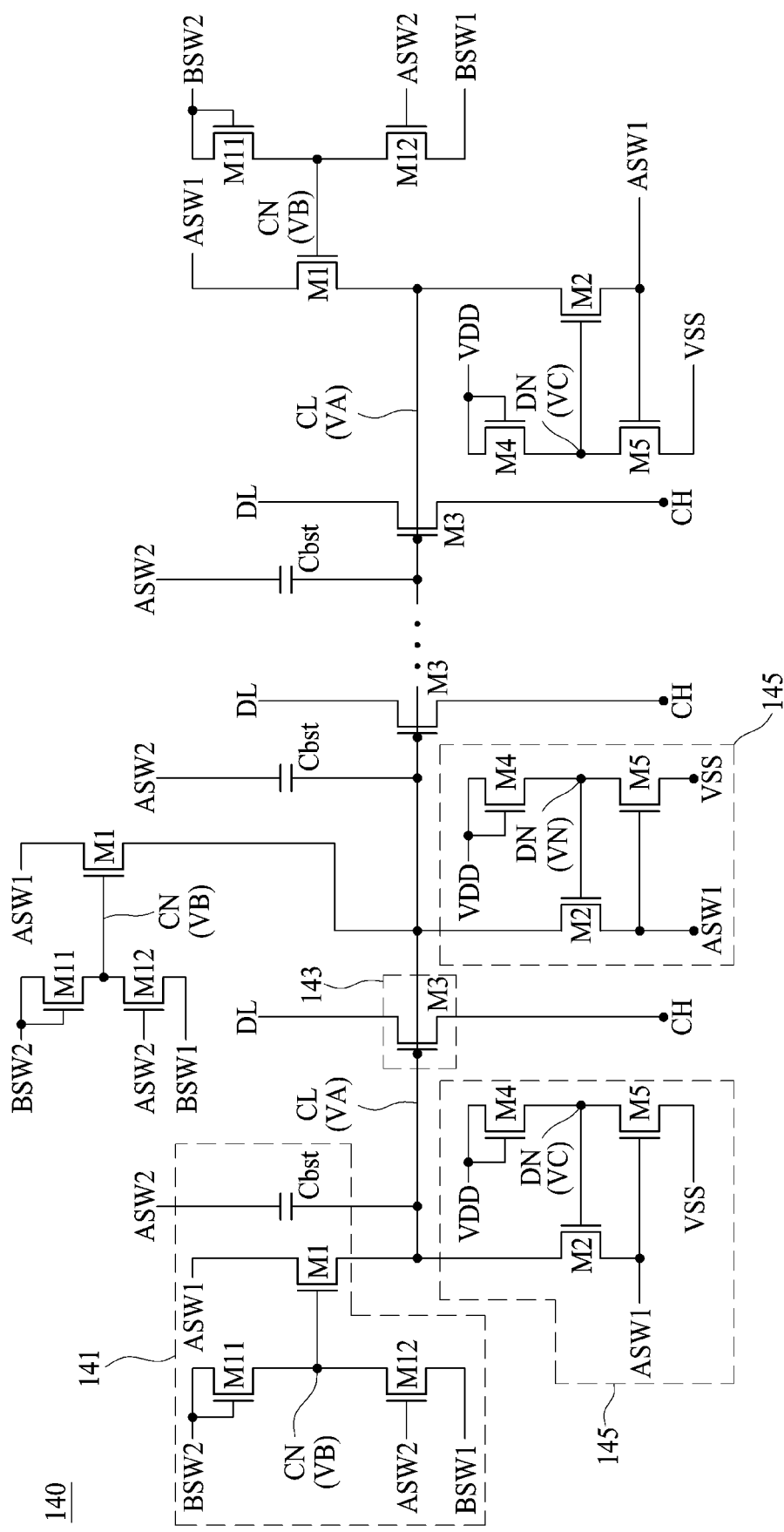
FIG. 21 is a circuit view illustrating further still another example of a demultiplexing circuit portion shown in FIG. 14.

FIG. 21 is a circuit view illustrating further still another example of a demultiplexing circuit portion shown in FIG. 14.

Referring to FIG. 21, the demultiplexing circuit portion 140 may include a set of a first transistor M1, a charge transistor M11 and a first discharge transistor M12 and a set of second, fourth and fifth transistors M2, M4 and M5, which are arranged at each of both ends of one control line CL, wherein one control line CL may be connected with a plurality of capacitors Cbst and a plurality of third transistors M3.

The voltage controller 141 of the demultiplexing circuit portion 140 may further include p number of first transistors M1 (p is a natural number of 1 to (n/i−2)) turned on based on the voltage VB of the charge node CN controlled by the kth auxiliary signal and the k+1th auxiliary signal to supply the kth time-division control signal to the kth control line.

The voltage controller 141 may further include p charge transistors M11 turned on based on the k+1th auxiliary signal to supply the k+1th auxiliary signal to the charge node CN connected with the gate electrode of each of the p number of first transistors M1, and may further include p number of first discharge charge transistors M12 turned on based on the kth auxiliary signal to discharge the voltage VB of the charge node CN connected with the gate electrode of each of the p number of first transistors M1.

The voltage discharge portion 145 of the demultiplexing circuit portion 140 may further include p number of second transistors M2 (p is a natural number of 1 to (n/i−2)) turned on based on the voltage VC of the discharge node DN controlled by the kth time-division control signal to discharge the kth control line CL.

The voltage discharge portion 145 may further include a plurality of fourth transistors M4 turned on based on a power voltage VDD to supply the power voltage VDD to the discharge node DN and a plurality of fifth transistors M5 turned on based on the kth time-division control signal to discharge the discharge node DN, and the number of each of the plurality of fourth transistors M4 and the plurality of fifth transistors M5 may be equal to the number of the second transistors M2.

According to one example, the demultiplexing circuit portion 140 may further include a set of a first transistor M1, a charge transistor M11 and a first discharge transistor M12 and a set of second, fourth and fifth transistors M2, M4 and M5 by grouping a plurality of capacitors Cbst and a plurality of third transistors M3 in a predetermined unit to correspond to each of the plurality of groups. For example, if the display apparatus includes n data lines DL1 to DLn and the demultiplexing circuit portion 140 is connected with three control lines CL_A, CL_B and CL_C, since one control line CL is connected with n/3 data lines DL, the demultiplexing circuit portion 140 may include n/3 third transistors M3 connected with one control line CL. At this time, the demultiplexing circuit portion 140 may further include a set of n/30 first transistors M1, charge transistors M11 and first discharge transistors M12 and a set of n/30 second, fourth and fifth transistors M2, M4 and M5 by grouping a plurality of capacitors Cbst and a plurality of third transistors M3 in a unit of 10 capacitors Cbst and 10 third transistors M3. In this way, the demultiplexing circuit portion 140 may further include a set of a first transistor M1, a charge transistor M11 and a first discharge transistor M12 and a set of second, fourth and fifth transistors M2, M4 and M5, which correspond to each of a plurality of groups of a plurality of capacitors Cbst and a plurality of third transistors M3, whereby charging characteristic and discharging characteristic may simultaneously be improved in all areas of the control line CL to stably maintain the voltage VA of the control line CL and overcome a limitation caused by degradation of the second transistor M2 and therefore an off current capable of being transferred to an organic light emitting diode may be prevented from occurring.

According to another example, the demultiplexing circuit portion 140 may include a set of a first transistor M1, a charge transistor M1l and a first discharge transistor M12 and a set of second, fourth and fifth transistors M2, M4 and M5, which correspond to each of a plurality of capacitors Cbst and a plurality of third transistors M3. For example, if the display apparatus includes n data lines DL1 to DLn and the demultiplexing circuit portion 140 is connected with three control lines CL_A, CL_B and CL_C, since one control line CL is connected with n/3 data lines DL, the demultiplexing circuit portion 140 may include a set of n/3 first transistors M1, charge transistors M11 and first discharge transistors M12 and a set of n/3 second, fourth and fifth transistors M2, M4, and M5 including a set of a first transistor M1, a charge transistor M11 and a first discharge transistor M12 and a set of second, fourth and fifth transistors M2, M4 and M5, which are arranged at each of both ends of the control line CL.

According to one example, if the demultiplexing circuit portion 140 includes a first transistor M1, a charge transistor M11, a first discharge transistor M12, a second transistor M2, a fourth transistor M4, and a fifth transistor M5 in a plurality of sets, the demultiplexing circuit 140 may divide the kth control line CL into the number of sets of the transistors to charge and discharge the voltage VA of the divided kth control lines CL through a set of the first transistor M1, the charge transistor M11, the first discharge transistor M12, the second transistor M2, the fourth transistor M4 and the fifth transistor M5. At this time, the demultiplexing circuit portion 140 may minimize a time constant (t=RC) according to a resistor and a capacitor connected with the control line CL by dividing the control line CL. Therefore, the demultiplexing circuit portion 140 may enable high speed driving by dividing the control line CL and embody image of high resolution while reducing the number of output channels CH.

The description of the demultiplexing circuit portion 140 according to one example and another example is only exemplary, and is not limited to the number of the transistors. Therefore, the demultiplexing circuit portion 140 may improve charging characteristic and discharging characteristic in all areas of the control line CL and vary the number of a set of the first transistors M1, the charge transistors M11, the first discharge transistors M12, the second transistors M2, the fourth transistors M4 and the fifth transistors M5 within the range that does not need excessive cost.

Figure 22:
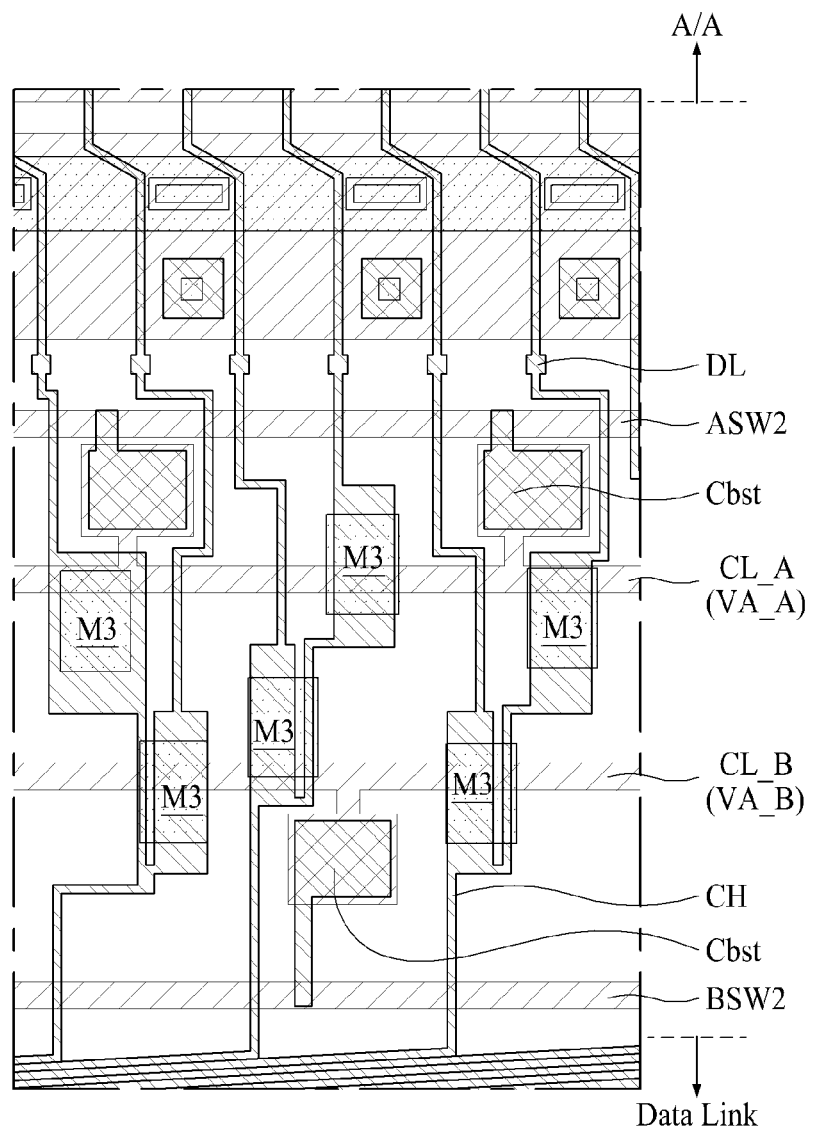
FIG. 22 is a plane view briefly illustrating a demultiplexing circuit portion shown in FIG. 1 according to one embodiment of the present disclosure.
Figure 23:
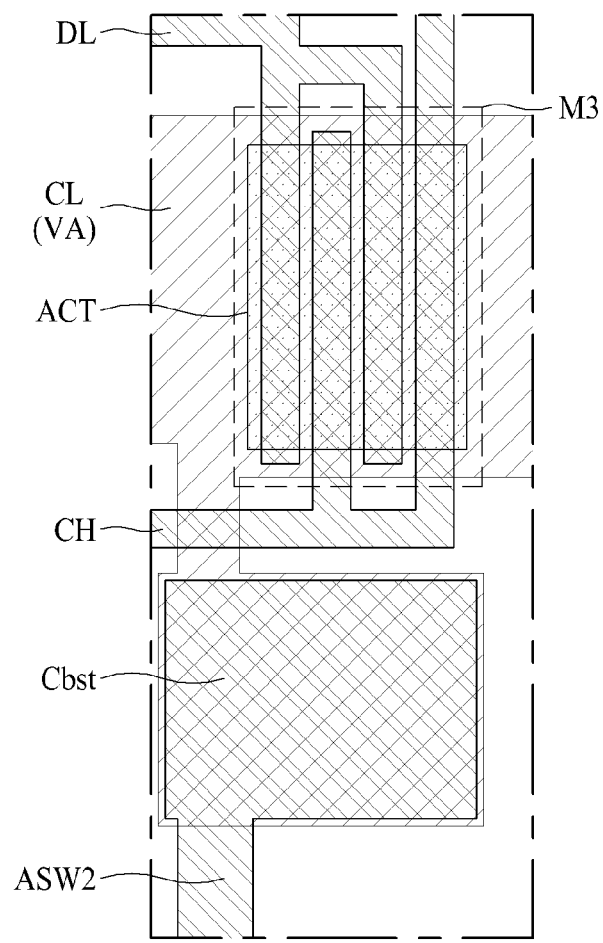
FIG. 23 is a view partially illustrating an example of a demultiplexing circuit portion shown in FIG. 22.

FIG. 22 is a plane view briefly illustrating a layout of a demultiplexing circuit portion shown in FIG. 1, and FIG. 23 is a view partially illustrating an example of a demultiplexing circuit portion shown in FIG. 22.

Referring to FIGS. 22 and 23, if the demultiplexing circuit portion 140 is connected with two control lines CL_A and CL_B and connected with n data lines DL, the plurality of driving integrated circuits 123 of the data driving circuit portion 120 may have n/2 output channels CH. Therefore, as the display apparatus comprises the demultiplexing circuit portion 140 connected with two control lines CL_A and CL_B, image of high resolution may be embodied while the number of output channels CH of the plurality of driving integrated circuits 123 may be reduced to ½ as compared with the display apparatus that does not comprise the demultiplexing circuit portion 140.

Each of the plurality of driving integrated circuits 123 may supply a data signal to the demultiplexing circuit portion 140 through a plurality of output channels CH connected with a data link. The first and second control lines CL_A and CL_B may be extended in a first direction, and may be arranged to be spaced apart from each other in a second direction. In this case, the demultiplexing circuit portion 140 may supply a data signal DS1 to first data lines DL1, DL3, . . . , DLn−1 of two kinds of data lines DL corresponding to each of the plurality of output channels CH by turning on the third transistor M3 connected with the first control line CL_A, and may supply a data signal DS2 to second data lines DL2, DL4, . . . , DLn of two kinds of data lines DL corresponding to each of the plurality of output channels CH by turning on the third transistor M3 connected with the second control line CL_B. In this case, an input line of the first auxiliary signal ASW2 may be arranged between the first control line CL_A and the display area A/A and an input line of the second auxiliary signal BSW2 may be arranged between the second control line CL_B and the data link, but may not be limited to this arrangement. The first and second time-division control signals ASW1 and BSW1 may freely be arranged at one side or the other side of each of the first and second control lines CL_A and CL_B.

The capacitor Cbst may include a first electrode provided on the same layer as the gate electrode of the third transistor M3, and a second electrode spaced apart from the source electrode and the drain electrode of the third transistor M3 on the same layer as the source electrode and the drain electrode of the third transistor M3.

According to one example, the capacitor Cbst may be arranged between the first control line CL_A and the input line of the first auxiliary signal ASW2 or between the second control line CL_B and the input line of the second auxiliary signal BSW2. For example, the capacitor Cbst may be arranged to correspond to each of the third transistors M3 of the switching portion 143. For another example, the capacitor Cbst may be arranged by grouping a plurality of third transistors M3 in a predetermined unit to correspond to each of the plurality of groups.

According to one example, the drain electrode of the third transistor M3 may be connected with the output channel CH of the driving integrated circuit 123, and may have two divergences. The source electrode of the third transistor M3 may be connected with the data line DL, and may have two divergences. Two divergences of the drain electrode of the third transistor M3 and two divergences of the source electrode of the third transistor M3 may be alternately arranged in an area overlapped with the gate electrode of the third transistor M3. For example, one divergence of the drain electrode of the third transistor M3 may be arranged between two divergences of the source electrode of the third transistor M3, and one divergence of the source electrode of the third transistor M3 may be arranged between two divergences of the drain electrode of the third transistor M3. In this way, as each of the drain electrode and the source electrode of the third transistor M3 may include two divergences, the demultiplexing circuit portion 140 may minimize a layout area where one third transistor M3 is arranged.

Figure 24:
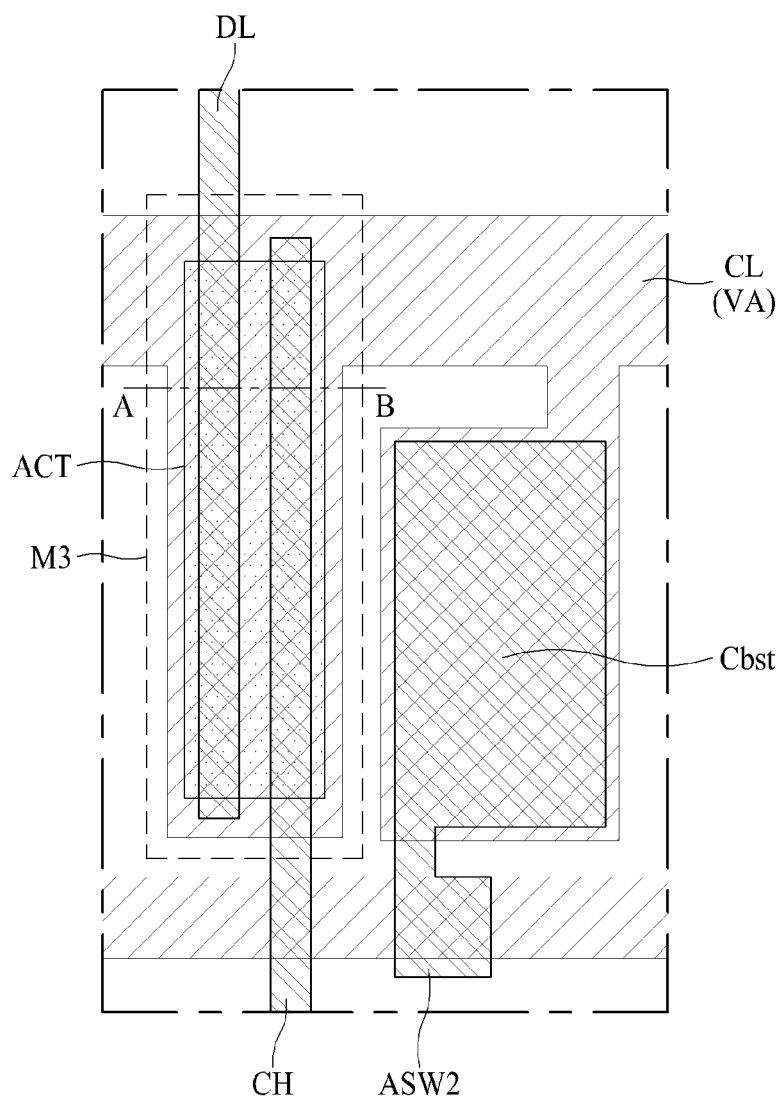
FIG. 24 is a view partially illustrating another example of a demultiplexing circuit portion shown in FIG. 22.

FIG. 24 is a view partially illustrating another example of a demultiplexing circuit portion shown in FIG. 22.

Referring to FIG. 24, the control line CL may be connected with the gate electrode of the third transistor M3 while being extended in a first direction, and the input line of the first auxiliary signal ASW2 may be connected with the second electrode of the capacitor Cbst while being extended in a first direction to be spaced apart from the control line CL. The gate electrode of the third transistor M3 may be arranged between the control line CL and the input line of the first auxiliary signal ASW2. The drain electrode of the third transistor M3 may be overlapped with the gate electrode of the third transistor M3 while being connected with the output channel CH of the driving integrated circuit 123, and the source electrode of the third transistor M3 may be overlapped with the gate electrode of the third transistor M3 while being connected with the data line DL. That is, the drain electrode and the source electrode of the third transistor M3 may be arranged to be spaced apart from each other on the same layer.

The capacitor Cbst may be arranged at one side of the gate electrode of the third transistor M3 while being arranged between the control line CL and the input line of the first auxiliary signal ASW2. At this time, the capacitor Cbst may have a size corresponding to a length of the drain and source electrodes of the third transistor M3, which are overlapped with the gate electrode. For example, if each of the drain electrode and the source electrode of the third transistor M3 does not have a plurality of divergences, its length overlapped with the gate electrode may be longer than the case that each of the drain electrode and the source electrode of the third transistor M3 has a plurality of divergences. At this time, if the length of each of the drain electrode and the source electrode of the third transistor M3, which is overlapped with the gate electrode, becomes longer, the length of the capacitor Cbst may be increased.

Various designs and modifications may be made in the layout of the aforementioned control line CL, the aforementioned input line of the first auxiliary signal ASW2, the aforementioned third transistor M3, and the aforementioned capacitor Cbst in accordance with other matters without limitation to the aforementioned description and drawings.

Figure 25:
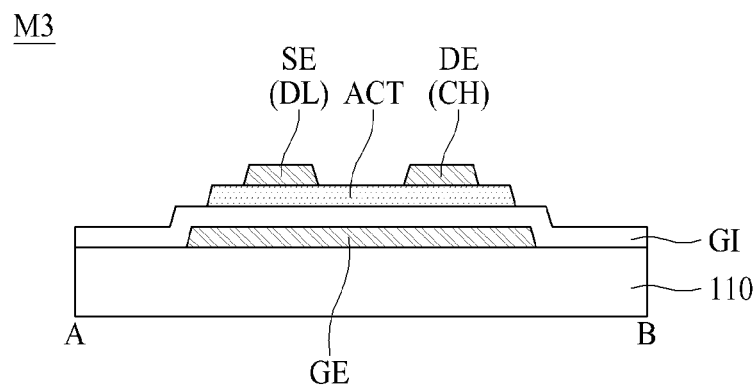
FIG. 25 is one example of a cross-sectional view taken along line A-B shown in FIG. 24.

FIG. 25 is one example of a cross-sectional view taken along line A-B shown in FIG. 24.

Referring to FIG. 25, the third transistor M3 may include a gate electrode GE, a gate insulating film GI, an oxide semiconductor layer ACT, a source electrode SE, and a drain electrode DE.

The gate electrode GE may be arranged on the substrate 110 and electrically be connected with the control line CL. According to one example, the gate electrode GE may include at least one of Al based metal such as Al and Al alloy, Ag based metal such as Ag and Ag alloy, Cu based metal such as Cu and Cu alloy, Mo based material such as Mo and Mo alloy, Cr, Ta, Nd and Ti. Also, the gate electrode GE may have a multi-layered structure that includes at least two conductive films having their respective physical properties different from each other.

The gate insulating film GI may be arranged on the gate electrode GE. According to one example, the gate insulting film GI may include at least one of silicon oxide and silicon nitride, or may include $Al_2O_3$. The gate insulating film GI may have a single film structure or a multi-layered structure.

The oxide semiconductor layer ACT may be arranged on the gate insulating film GI to partially overlap the gate electrode GE. The oxide semiconductor layer ACT may correspond to a channel layer or an active layer. According to one example, the oxide semiconductor layer ACT may include an oxide semiconductor material. For example, the oxide semiconductor layer ACT may be made of an oxide semiconductor material such as IZO (InZnO)-, IGO (InGaO)-, ITO (InSnO)-, IGZO (InGaZnO)-, IGZTO (InGaZnSnO), GZTO (GaZnSnO)-, GZO (GaZnO)-, and ITZO (InSnZnO)-based oxide semiconductor materials. However, the oxide semiconductor layer ACT is not limited to the above materials, and may be made of other oxide semiconductor materials known in the art.

The source electrode SE may be arranged on the oxide semiconductor layer ACT and electrically connected with the data line DL. The drain electrode DE may be arranged to be spaced apart from the source electrode SE on the oxide semiconductor layer ACT and electrically connected with the output channel CH of the driving integrated circuit 123.

The source electrode SE and the drain electrode DE may include at least one of Mo, Al, Cr, Au, Ti, Ni, Nd, Cu, and their alloy. Each of the source electrode SE and the drain electrode DE may be made of a single layer of metal or metal alloy or a multi-layer of two or more layers.

As described above, the demultiplexing circuit portion 140 may be made of an oxide based thin film transistor. In detail, transistors of the demultiplexing circuit portion 140 have a back channel etch (BCE) structure in which a channel area is exposed during a process of forming the source electrode SE and the drain electrode DE. Since the display apparatus according to the present disclosure embodies the demultiplexing circuit portion using an oxide based thin film transistor through the BCE process, it is possible to minimize a mask process, improve a lithography process margin and provide excellent reliability.

Figure 26:
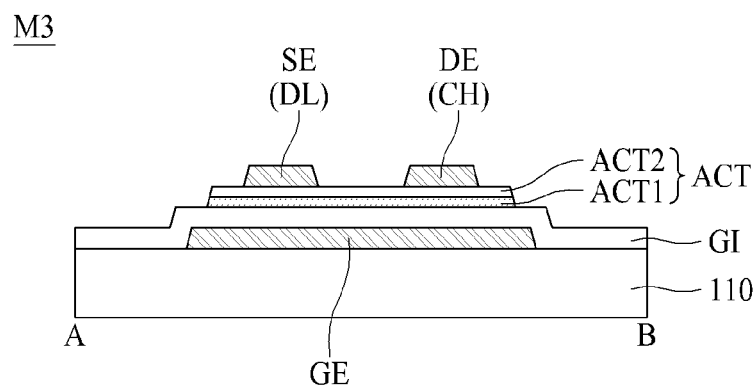
FIG. 26 is another example of a cross-sectional view taken along line A-B shown in FIG. 24.

FIG. 26 is another example of a cross-sectional view taken along line A-B shown in FIG. 24.

Referring to FIG. 26, the third transistor M3 may include a gate electrode GE, a gate insulating film GI, an oxide semiconductor layer ACT, a source electrode SE, and a drain electrode DE, wherein the oxide semiconductor layer ACT may include first and second oxide semiconductor layers ACT1 and ACT2.

The first oxide semiconductor layer ACT1 may be arranged on the gate insulating film GI to partially overlap the gate electrode GE. The first oxide semiconductor layer ACT1 may correspond to a channel layer or an active layer. According to one example, the first oxide semiconductor layer ACT1 may include an oxide semiconductor material. For example, the first oxide semiconductor layer ACT1 may be made of an oxide semiconductor material such as IZO (InZnO)-, IGO (InGaO)-, ITO (InSnO)-, IGZO (InGaZnO)-, IGZTO (InGaZnSnO), GZTO (GaZnSnO)-, GZO (GaZnO)-, and ITZO (InSnZnO)-based oxide semiconductor materials. However, the first oxide semiconductor layer ACT1 is not limited to the above materials, and may be made of other oxide semiconductor materials known in the art.

The second oxide semiconductor layer ACT2 may be arranged on the first oxide semiconductor layer ACT1 to protect the first oxide semiconductor layer ACT1. In detail, the second oxide semiconductor layer ACT2 may include nitrogen of a concentration higher than that of the first oxide semiconductor layer ACT1, and may have film stability more excellent than that of the first oxide semiconductor layer ACT1. For example, the nitrogen contained in the second oxide semiconductor layer ACT2 may form a stable bonding with oxygen, and may stably be arranged between metal elements. In this way, the second oxide semiconductor layer ACT2 containing nitrogen may have excellent film stability. Since the second oxide semiconductor layer ACT2 has excellent durability with respect to processes such as exposure, etching, patterning and heat treatment to manufacture the thin film transistor, the second oxide semiconductor layer ACT2 may protect the first oxide semiconductor layer ACT1 there below.

As described above, the demultiplexing circuit portion 140 may be made of an oxide based thin film transistor. In detail, transistors of the demultiplexing circuit portion 140 have a back channel etch (BCE) structure in which a channel area is exposed during a process of forming the source electrode SE and the drain electrode DE. For example, the channel area of the demultiplexing circuit portion 140 may be exposed from the source electrode SE and the drain electrode DE by etching and patterning for forming the source electrode SE and the drain electrode DE during a process of manufacturing a thin film transistor of a BCE structure. At this time, the oxide semiconductor layer ACT may be exposed to an etching gas or an etching solution. Although the second oxide semiconductor layer ACT2 is exposed to an etching gas or an etching solution, since the second oxide semiconductor layer ACT2 includes nitrogen and therefore has excellent film stability, the demultiplexing circuit portion 140 according to the present disclosure is not damaged by the etching gas or the etching solution. Therefore, since the second oxide semiconductor layer ACT2 has excellent film stability over all areas, the second oxide semiconductor layer ACT2 may efficiently protect the first oxide semiconductor layer ACT1.

Since the display apparatus according to the present disclosure embodies the demultiplexing circuit portion using an oxide based thin film transistor through the BCE process, it is possible to minimize a mask process, improve a lithography process margin and provide excellent reliability.

Consequently, since the display apparatus according to the present disclosure comprises a demultiplexing circuit portion using an oxide based thin film transistor, the demultiplexing circuit portion is capable of maintaining a stable output by overcoming a limitation due to low mobility and degradation as compared with an LTPS based thin film transistor by reinforcing a charging function of a control line in response to a time-division control signal. Since the display apparatus comprises a demultiplexing circuit portion using an oxide based thin film transistor, a pixel charging rate may be enhanced by reinforcing charging of the control line and therefore discharging characteristic of the control line may be improved. Also, the display apparatus comprises a demultiplexing circuit portion using an oxide based thin film transistor, and at the same time may prevent an off current capable of being transferred to an organic light emitting diode from occurring, minimize a bezel area, and embody an image of high resolution of a display panel. Also, a demultiplexing circuit portion using an oxide based thin film transistor is embodied through a back channel etch (BCE) process, whereby it is possible to minimize a mask process, improve a lithography process margin and provide excellent reliability.

A display apparatus according to an embodiment of the present disclosure will be described below.

A display apparatus according to the present disclosure may include a demultiplexing circuit portion for sequentially supplying data signals supplied from a data driving circuit to at least two data lines, the demultiplexing circuit portion including: a switching portion for sequentially supplying the data signals to the at least two data lines based on a voltage of a control line, a voltage controller for controlling the voltage of the control line in response to a time-division control signal and an auxiliary signal partially overlapped with the time-division control signal, and a voltage discharge portion for discharging the voltage of the control line in response to the time-division control signal.

A display apparatus according to the present disclosure may include n data lines, a demultiplexing circuit portion connected to first to ith (i is a natural number of 2 or more) control lines and connected to the n data lines, and a data driving circuit having first to n/ith output channels connected to the demultiplexing circuit portion, the demultiplexing circuit portion including: a voltage controller for controlling voltages of the first to ith control lines in response to first to ith time-division control signals and auxiliary signals partially overlapped with each of the first to ith time-division control signals, a switching portion for sequentially supplying data signals supplied from the first to n/ith output channels to the n data lines based on the voltage of each of the first to ith control lines, and a voltage discharge portion for discharging the voltages of the first to ith control lines in response to the first to ith time-division control signals.

A display apparatus according to the present disclosure may include a plurality of pixels on a substrate; a plurality of data lines on the substrate, a data line connected to a corresponding column of pixels; a first control line connected to a first set of data lines; a second control line connected to a second set of data lines; and a demultiplexing circuit configured to receive a plurality of data signals from a data driving circuit for supply to the plurality of data lines during a horizontal period that includes at least a first sub-horizontal period and a second sub-horizontal period subsequent the first sub-horizontal period, the plurality of data signals including first data signals for supply to the first set of data lines during the first sub-horizontal period, and second data signals for supply to the second set of data lines during the second sub-horizontal period, the demultiplexing circuit including: a first set of switches connected to the first set of data lines and to a first control line, the first set of switches configured to turn on for the first sub-horizontal period to supply the first data signals to the first set of data lines, a first discharge portion connected to the first control line, the first discharge portion configured to discharge the first control line when turned on, a second set of switches connected to a second set of data lines and to a second control line, the second set of switches configured to turn on for the second sub-horizontal period to supply the second data signals to the second set of data lines, and a second discharge portion connected to the second control line, the second discharge portion configured to discharge the second control line when turned on.

According to some embodiments of the present disclosure, the first set of switches and the second set of switches are transistors including an oxide semiconductor active layer.

According to some embodiments of the present disclosure, the first set of switches are configured to turn on for the first sub-horizontal period in response to receiving a first time-division control signal for the first sub-horizontal period via the first control line, the second set of switches are configured to turn on for the second sub-horizontal period in response to receiving a second time-division control signal for the second sub-horizontal period via the second control line, and the first discharge portion is configured to turn on in response to receiving the second time-division control signal.

According to some embodiments of the present disclosure, the demultiplexing circuit further comprises a first voltage controller including a first transistor connected to the first discharge portion and a first charge node, the first transistor configured to turn on during a previous horizontal period to charge the first control line with the first time-division control signal, and a second voltage controller including another first transistor connected to the second discharge portion and a second charge node, the another first transistor configured to turn on during the previous horizontal period to charge the second control line with the second time-division control signal.

According to some embodiments of the present disclosure, the first voltage controller further comprises a first discharge transistor connected to the first charge node, the first discharge transistor configured to turn on in response to receiving a first auxiliary signal to discharge the first charge node during the first sub-horizontal period, and the second voltage controller further comprises another first discharge transistor connected to the second charge node, the another first discharge transistor configured to turn on in response to receiving a second auxiliary signal to discharge the second charge node during the second sub-horizontal period.

According to some embodiments of the present disclosure, the first time-division control signal overlaps with the first auxiliary signal.

According to some embodiments of the present disclosure, the first voltage controller further comprises a first charge transistor connected to the first charge node, the first charge transistor configured to turn on in response to receiving the second auxiliary signal of the previous horizontal period to charge the first charge node with the second auxiliary signal.

According to some embodiments of the present disclosure, the first discharge portion further comprises a second discharge transistor connected to the first control line, the second discharge transistor configured to receive the second auxiliary signal for the second sub-horizontal period to additionally discharge the first control line.

According to some embodiments of the present disclosure, the demultiplexing circuit further comprises a capacitor including an electrode connected to the first control line, the capacitor configured to receive a first auxiliary signal at another electrode to increase the voltage of the first control line.

According to some embodiments of the present disclosure, the first discharge portion includes a discharge transistor connected to the first control line and a discharge node, the first control line is configured to receive a first time-division control signal for the first sub-horizontal period, and the discharge transistor is configured to turn on responsive to turning off the first time-division control signal for the first sub-horizontal period to discharge the first control line.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display apparatus comprising a demultiplexing circuit portion for sequentially supplying data signals supplied from a data driving circuit to at least two data lines, the demultiplexing circuit portion including:
   a first switching portion for supplying data signals to a first data line of the at least two data lines based on a voltage of a first control line connected to the first switching portion;
   a first voltage controller configured to control the voltage of the first control line such that the first switching portion provides the data signals to the first data line, wherein the first voltage controller controls the voltage of the first control line to a first voltage in response to receiving a first time-division control signal that transitions from a first level to a second level at a first transition time and transitions back from the second level to the first level at a second transition time, and is further configured to increase the voltage of the first control line to a second voltage in response to receiving a first auxiliary signal that transitions from a third level to a fourth level at a third transition time between the first transition time and the second transition time;

a second switching portion for supplying data signals to a second data line based on a voltage of a second control line connected to the second switching portion;

a second voltage controller configured to control the voltage of the second control line such that the second switching portion provides the data signals to the second data line responsive to the second voltage controller receiving a second time-division control signal at a fourth transition time and a second auxiliary signal at a fifth transition time;

a first voltage discharge portion for discharging the voltage of the first control line to the first level in response to receiving the second time-division control signal at the fourth transition time; and a second voltage discharge portion for discharging the voltage of the second control line.

2. The display apparatus of claim 1, wherein the first auxiliary signal is partially overlapped with the first time-division control signal, the second time-division control signal is spaced apart from the first time-division control signal, and the second auxiliary signal is partially overlapped with the second time-division control signal.

3. The display apparatus of claim 2, wherein the first voltage controller further includes a first transistor turned on based on a voltage of a charge node controlled by the first auxiliary signal and the second auxiliary signal to supply the first time-division control signal to the first control line.

4. The display apparatus of claim 3, wherein the voltage of the charge node is additionally increased by gate-source capacitance of the first transistor if the first time-division control signal is applied to the first control line.

5. The display apparatus of claim 3, wherein the first voltage controller further includes a charge transistor turned on based on the second auxiliary signal to supply the second auxiliary signal to the charge node.

6. The display apparatus of claim 3, wherein the first voltage controller further includes a first discharge transistor turned on based on the first auxiliary signal for discharging the voltage of the charge node.

7. The display apparatus of claim 3, wherein the first voltage discharge portion includes a second transistor turned on based on a voltage of a discharge node controlled by the first time-division control signal for discharging the voltage of the first control line.

8. The display apparatus of claim 7, wherein the first voltage discharge portion further includes:
a fourth transistor turned on based on a power voltage for supplying the power voltage to the discharge node; and
a fifth transistor turned on based on the first time-division control signal for discharging the voltage of the discharge node.

9. The display apparatus of claim 7, wherein the discharge node has a voltage inverted with the first time-division control signal.

10. The display apparatus of claim 7, wherein the first switching portion includes a third transistor turned on from the first transition time of the first time-division control signal to the second transition time of the first time-division control signal for sequentially supplying the data signals to the at least two data lines.

11. The display apparatus of claim 2, wherein the first voltage controller further includes a capacitor for increasing the voltage of the first control line based on the first auxiliary signal.

12. The display apparatus of claim 2, wherein the first voltage discharge portion includes a second transistor turned on based on the second time-division control signal for primarily discharging the voltage of the first control line to the first level of the first time-division control signal.

13. The display apparatus of claim 12, wherein the first voltage discharge portion further includes a second discharge transistor turned on based on the second auxiliary signal for secondarily discharging the voltage of the first control line to the first level of the first time-division control signal.

14. The display apparatus of claim 2, wherein the first switching portion includes a third transistor turned on from the first transition time of the first time-division control signal to the fourth transition time of the second time-division control signal for sequentially supplying the data signals to the at least two data lines.

15. The display apparatus of claim 14, wherein the third transition time of the first auxiliary signal corresponds to a time period between the first transition time and the second transition time of the first time-division control signal, and the fifth transition time of the second auxiliary signal corresponds to a time period between the fourth transition time and a sixth transition time of the second time-division control signal.

* * * * *